US012713613B2

(12) United States Patent
Kobayashi et al.

(10) Patent No.: US 12,713,613 B2
(45) Date of Patent: Aug. 18, 2026

(54) SEMICONDUCTOR MEMORY DEVICE AND METHOD OF MANUFACTURING SEMICONDUCTOR MEMORY DEVICE

(71) Applicant: Kioxia Corporation, Tokyo (JP)

(72) Inventors: Shigeki Kobayashi, Kuwana (JP); Yoshinori Nakakubo, Yokkaichi (JP); Yasutaka Nonaka, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 986 days.

(21) Appl. No.: 17/304,191

(22) Filed: Jun. 16, 2021

(65) Prior Publication Data

US 2021/0313334 A1 Oct. 7, 2021

Related U.S. Application Data

(63) Continuation of application No. PCT/JP2020/009994, filed on Mar. 9, 2020.

(51) Int. Cl.

*H10B 43/35* (2023.01)
*G11C 16/04* (2006.01)
*H10B 43/10* (2023.01)
*H10B 43/27* (2023.01)

(52) U.S. Cl.

CPC ............. *H10B 43/35* (2023.02); *H10B 43/10* (2023.02); *H10B 43/27* (2023.02)

(58) Field of Classification Search

CPC ........ H10B 41/27; H10B 43/27; H10B 43/10; H10B 43/35; H01L 29/66174–66189; H01L 29/92–945; H01L 28/40–92

See application file for complete search history.

(56) References Cited

U.S. PATENT DOCUMENTS 6,504,765 B1 1/2003 Joo
7,372,730 B2 5/2008 Chen
10,424,384 B2 9/2019 Higashi et al.
10,629,675 B1 * 4/2020 Nishikawa ............. H10B 43/30
2012/0068250 A1 3/2012 Ino et al.
2014/0284674 A1 * 9/2014 Iwai ..................... G11C 29/702 257/298
2015/0262672 A1 9/2015 Fukuda
2015/0318296 A1 * 11/2015 Kim ....................... H10B 41/40 257/296
2017/0025421 A1 1/2017 Sakakibara et al.
2017/0053923 A1 * 2/2017 Hwang .................. G11C 5/025
2018/0082733 A1 * 3/2018 Tanaka ................ G11C 11/4094

(Continued)

FOREIGN PATENT DOCUMENTS

CN 104916314 A 9/2015
CN 110707094 A 1/2020

(Continued)

OTHER PUBLICATIONS

International Search Report issued Apr. 21, 2020 in PCT/JP2020/009994 filed on Mar. 9, 2020, 4 pages (with English Translation of Categories of Documents).

*Primary Examiner* — Mohsen Ahmadi

(74) *Attorney, Agent, or Firm* — Oblon, McClelland, Maier & Neustadt, L.L.P.

(57) ABSTRACT

According to one embodiment, a semiconductor memory device includes: a first bit line; a capacitor; and a first memory cell transistor and a second memory cell transistor that are coupled in series between the first bit line and the capacitor.

4 Claims, 28 Drawing Sheets

(56) References Cited

U.S. PATENT DOCUMENTS

| | | | | |
|---|---|---|---|---|
| 2018/0269203 | A1* | 9/2018 | Nojima | H01L 28/60 |
| 2018/0301191 | A1* | 10/2018 | Widjaja | G11C 14/0018 |
| 2018/0337054 | A1* | 11/2018 | Sung | H10B 10/00 |
| 2018/0358370 | A1* | 12/2018 | Hwang | H10B 43/40 |
| 2019/0088663 | A1* | 3/2019 | Shikata | G11C 16/10 |
| 2019/0267097 | A1 | 8/2019 | Higashi et al. | |
| 2019/0312052 | A1* | 10/2019 | Lee | H10B 43/35 |
| 2019/0348131 | A1* | 11/2019 | Watanabe | G11C 16/26 |
| 2019/0371407 | A1* | 12/2019 | Yamaoka | H10B 41/40 |
| 2020/0013468 | A1* | 1/2020 | Yoshida | G11C 16/10 |
| 2020/0013796 | A1 | 1/2020 | Fujita | |
| 2020/0027511 | A1* | 1/2020 | Futatsuyama | G11C 11/5642 |
| 2020/0194434 | A1* | 6/2020 | Alzate Vinasco | H01L 28/60 |
| 2020/0202948 | A1* | 6/2020 | Okuyama | G11C 16/24 |
| 2020/0312413 | A1* | 10/2020 | Wang | G11C 16/3418 |
| 2020/0335513 | A1* | 10/2020 | Morozumi | G11C 16/26 |
| 2020/0343244 | A1* | 10/2020 | Onuki | H01L 29/78648 |
| 2021/0090666 | A1* | 3/2021 | Sako | G11C 11/5628 |
| 2021/0125643 | A1* | 4/2021 | Sakakibara | G11C 16/24 |
| 2021/0175244 | A1* | 6/2021 | Shin | H01L 29/66833 |
| 2022/0254402 | A1* | 8/2022 | Yakubo | G11C 11/4096 |

FOREIGN PATENT DOCUMENTS

| | | | |
|---|---|---|---|
| JP | 09-063283 | A | 3/1997 |
| JP | 2005-353657 | A | 12/2005 |
| JP | WO2010/106922 | A1 | 9/2010 |
| JP | 2019-145191 | A | 8/2019 |

* cited by examiner

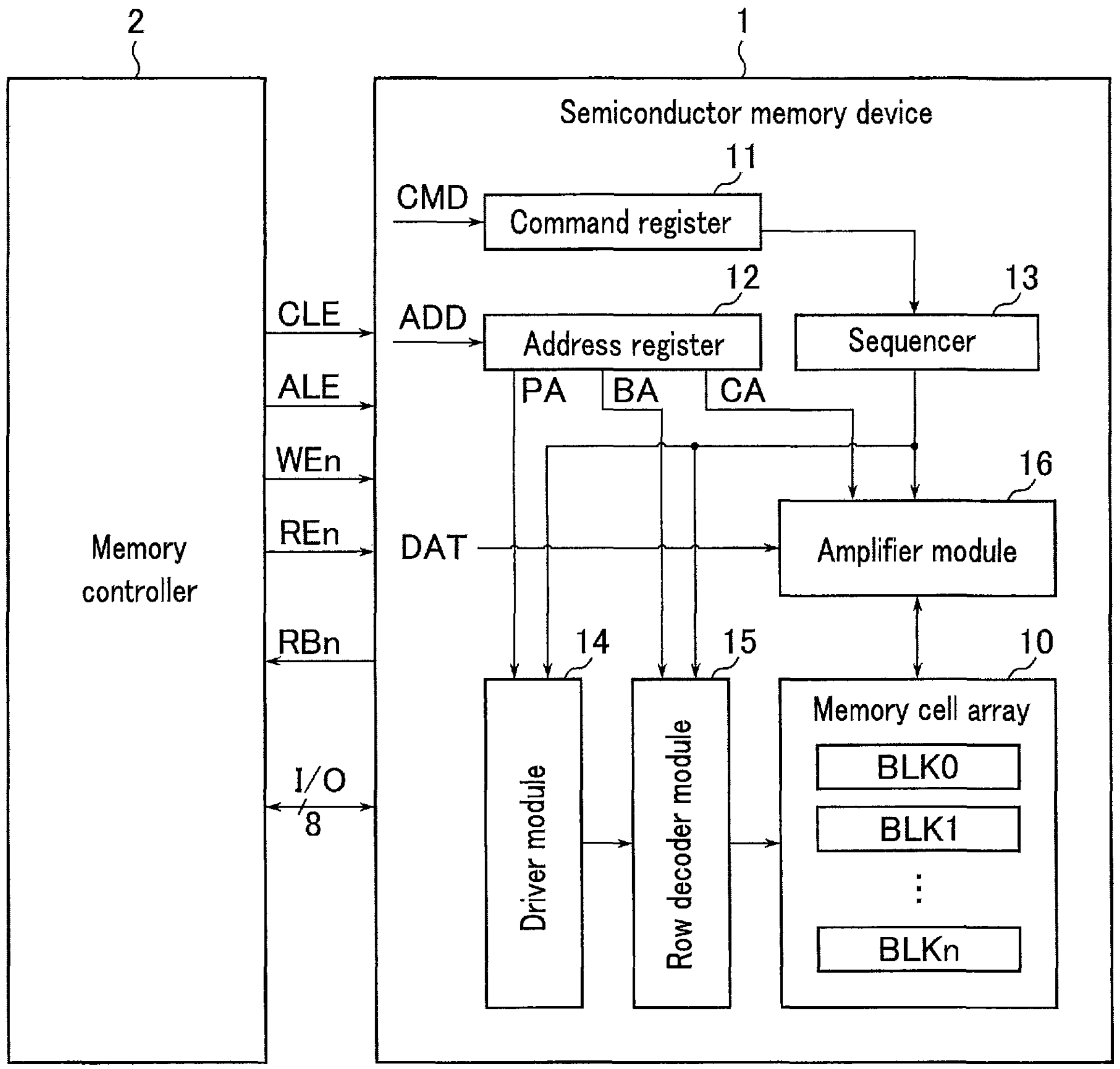
F I G. 1

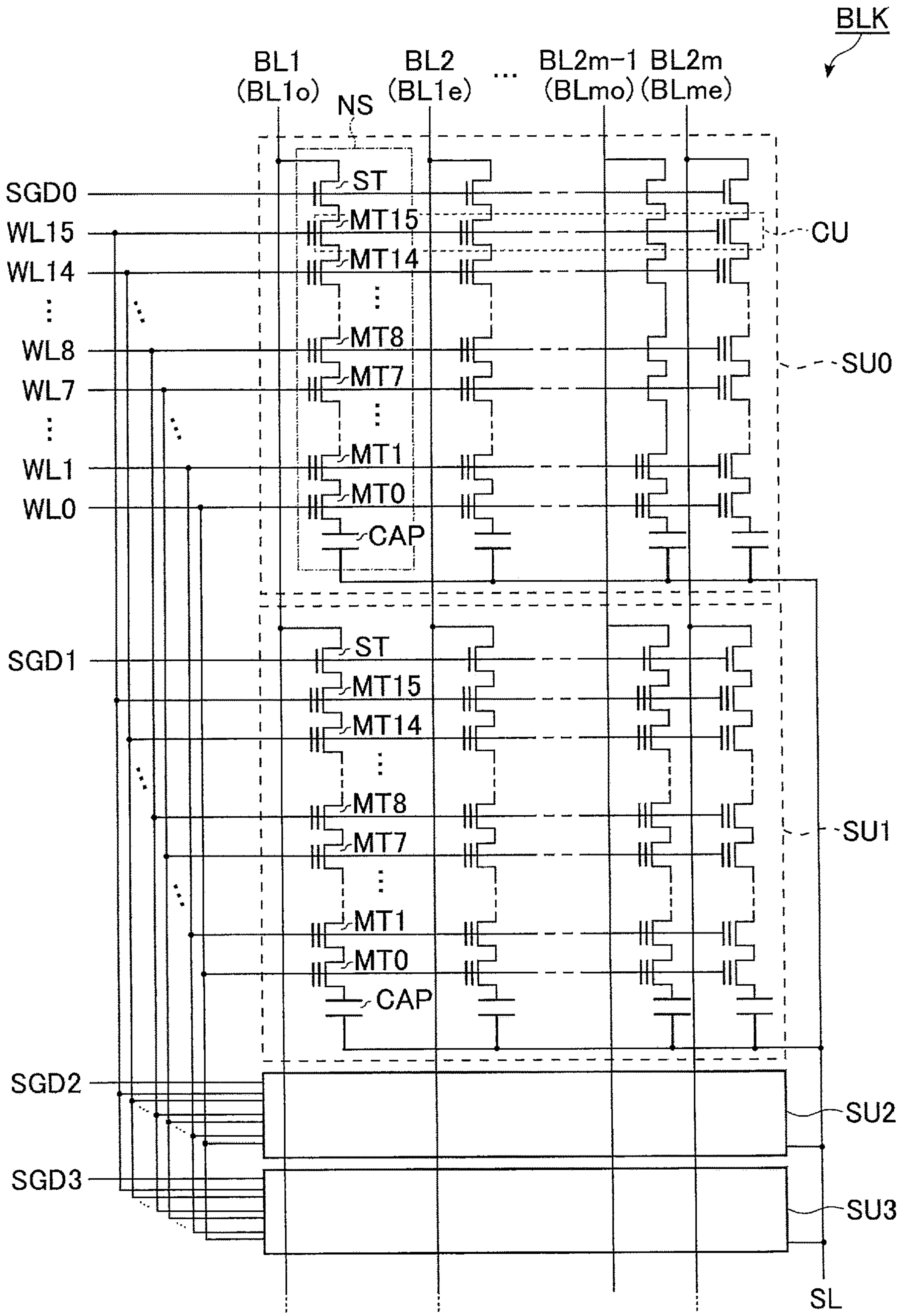
F I G. 2

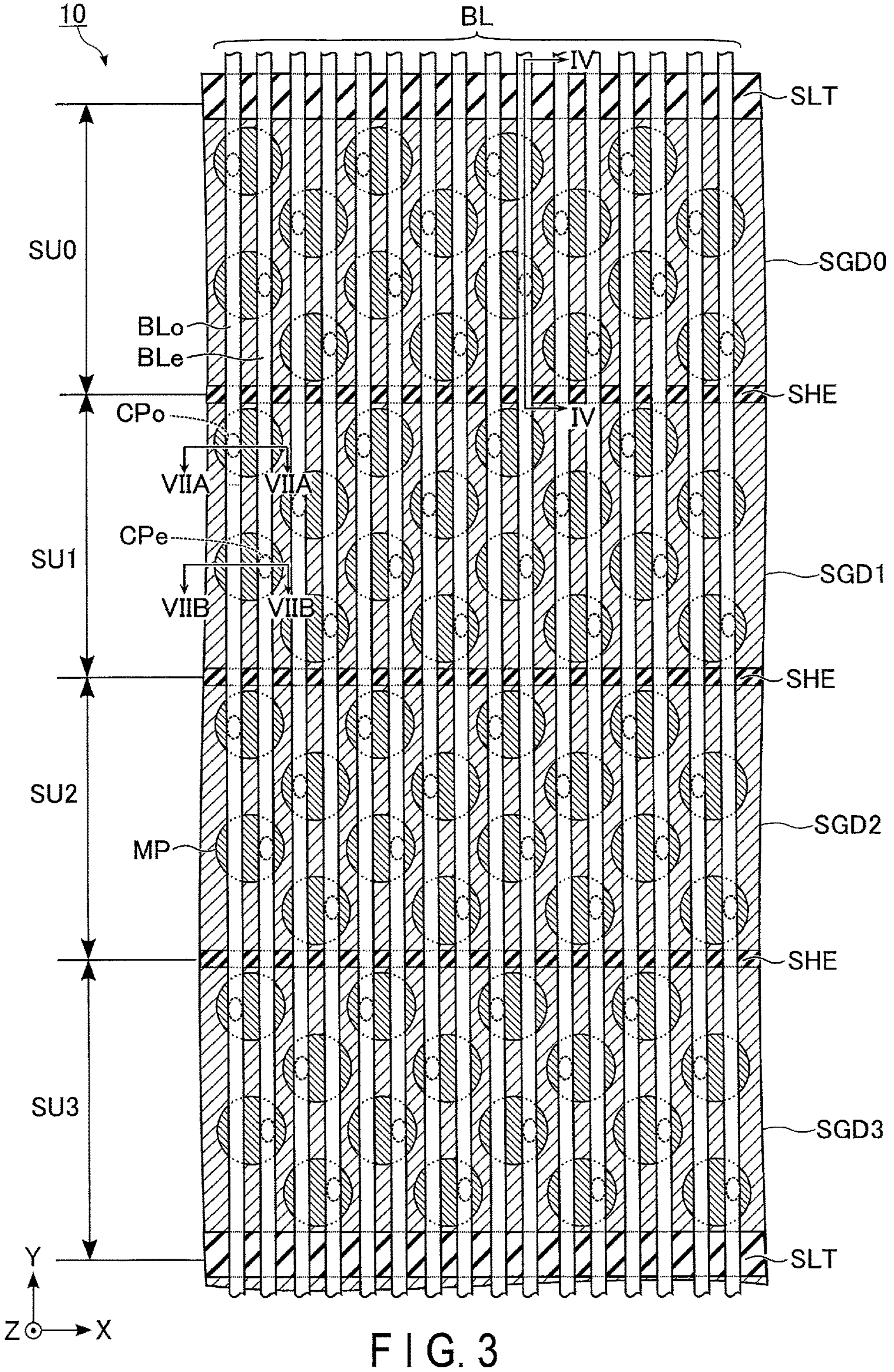
F I G. 3

25(BL)
24(CP)
37(SLT)
MP
36
38(SHE)
ST1
MT15
MT14
MT13
MT12
MT11
MT10
MT9
MT8
23(SGD)
22(WL15)
22(WL14)
22(WL13)
22(WL12)
22(WL11)
22(WL10)
22(WL9)
22(WL8)
UMP
JT
LMP
MT7
MT6
MT5
MT4
MT3
MT2
MT1
MT0
21(WL7)
21(WL6)
21(WL5)
21(WL4)
21(WL3)
21(WL2)
21(WL1)
21(WL0)
V
V
CAP
BTM
VI
VI
n+
n+
20
35A 35B
35
30 31 32
33 34

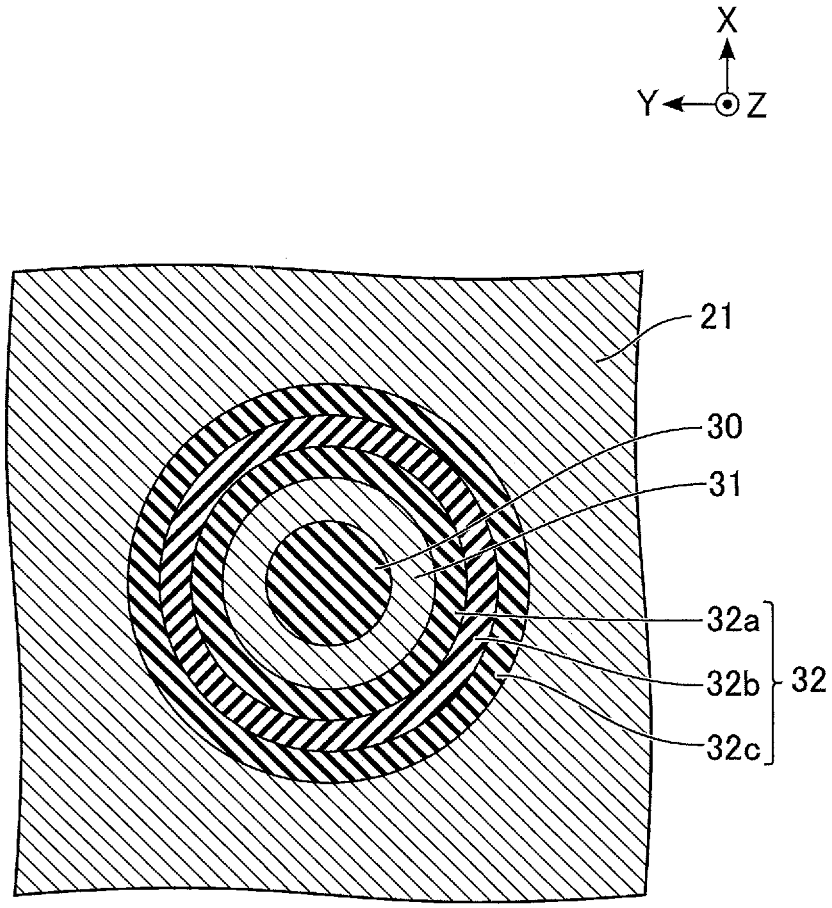
F I G. 5

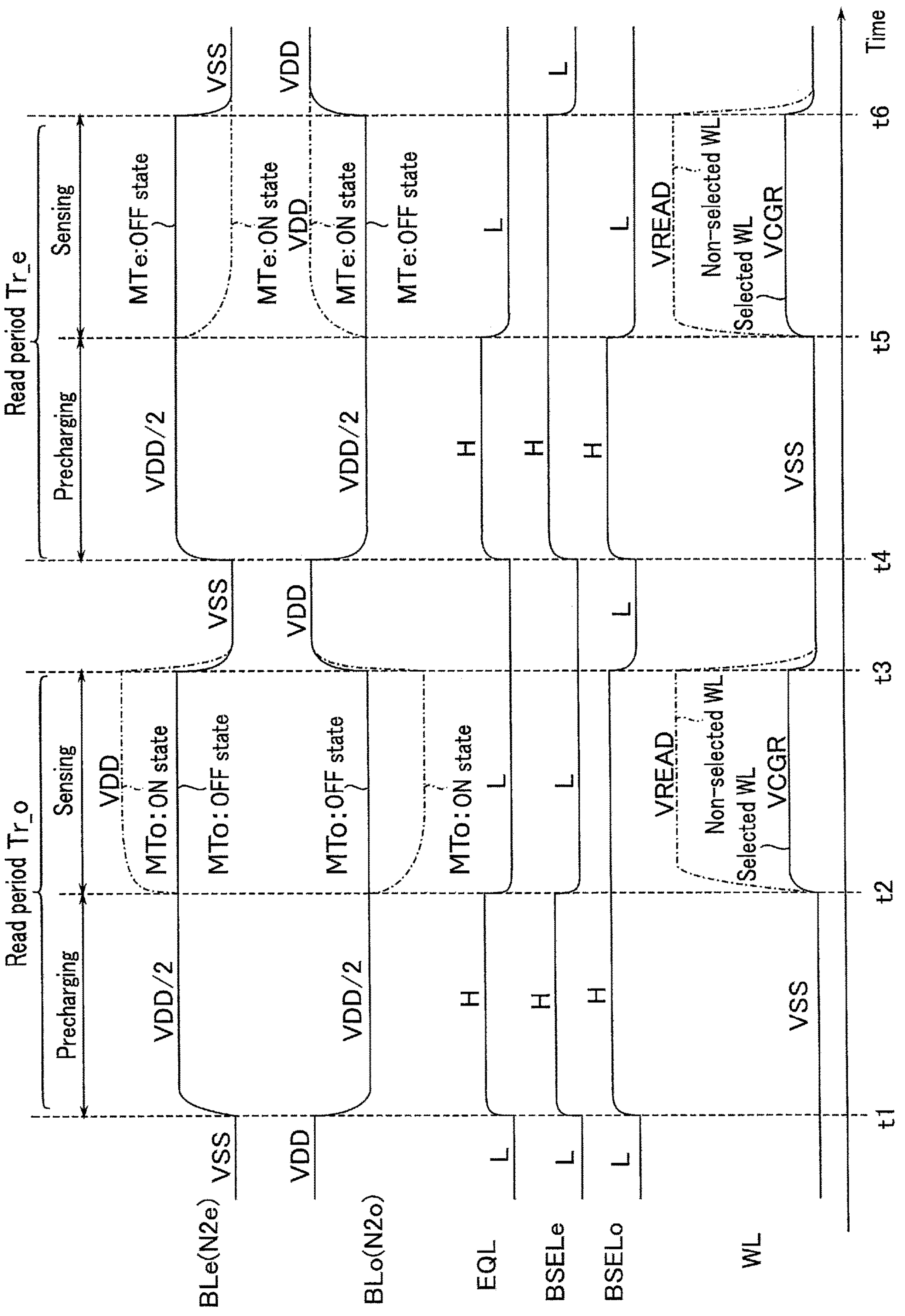
F I G. 9

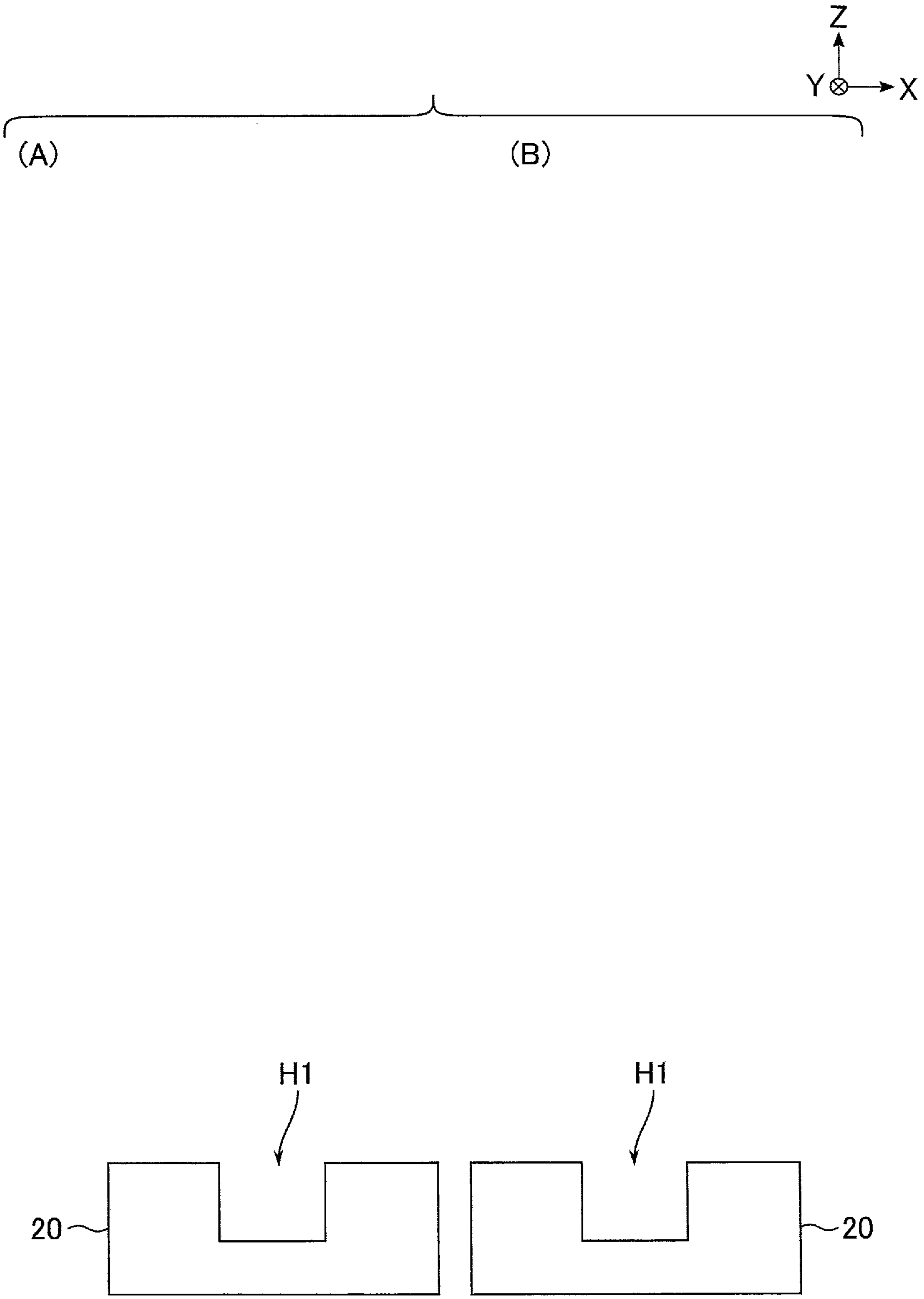
F I G. 10

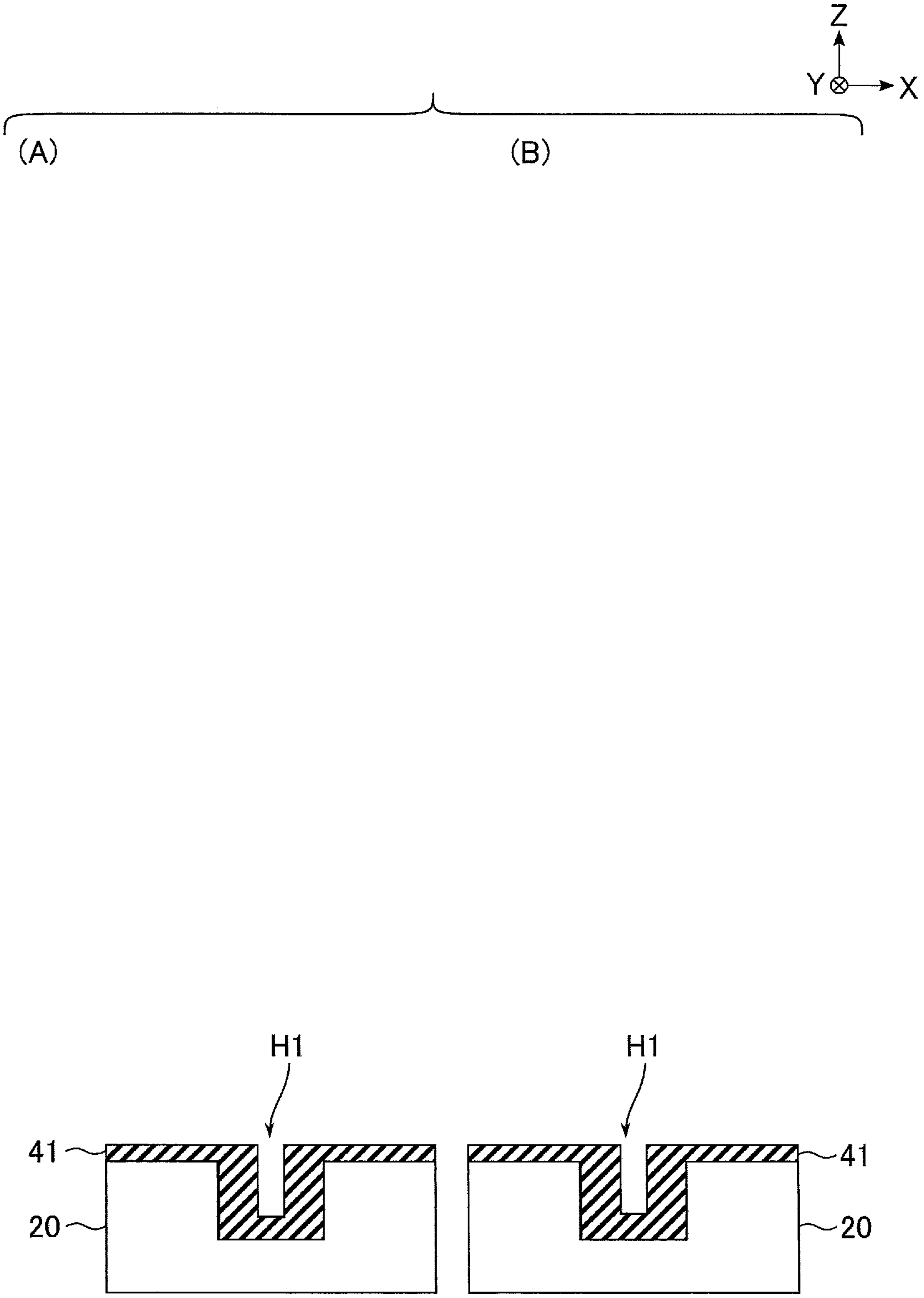
F I G. 11

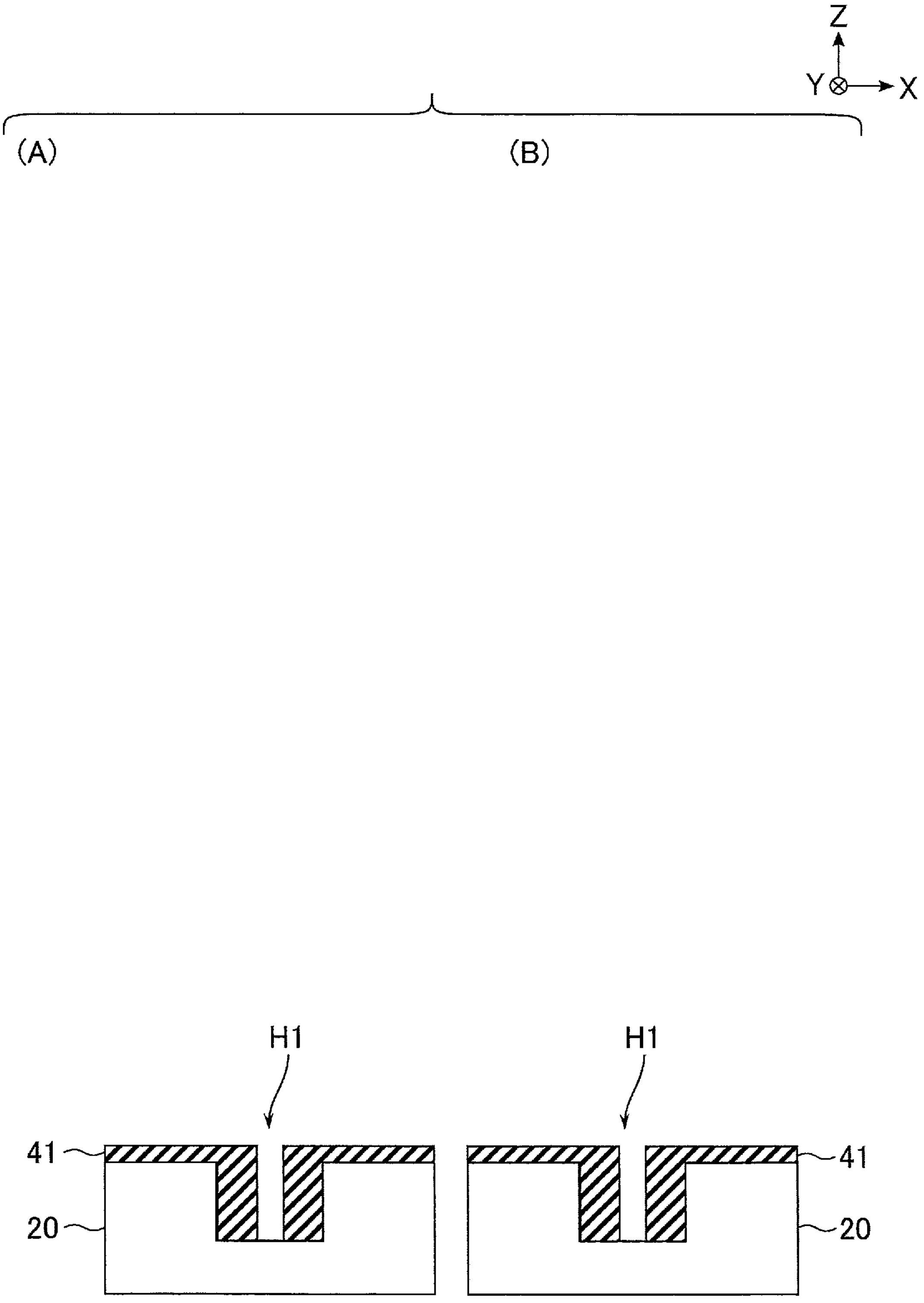
F I G. 12

F I G. 13

F I G. 14

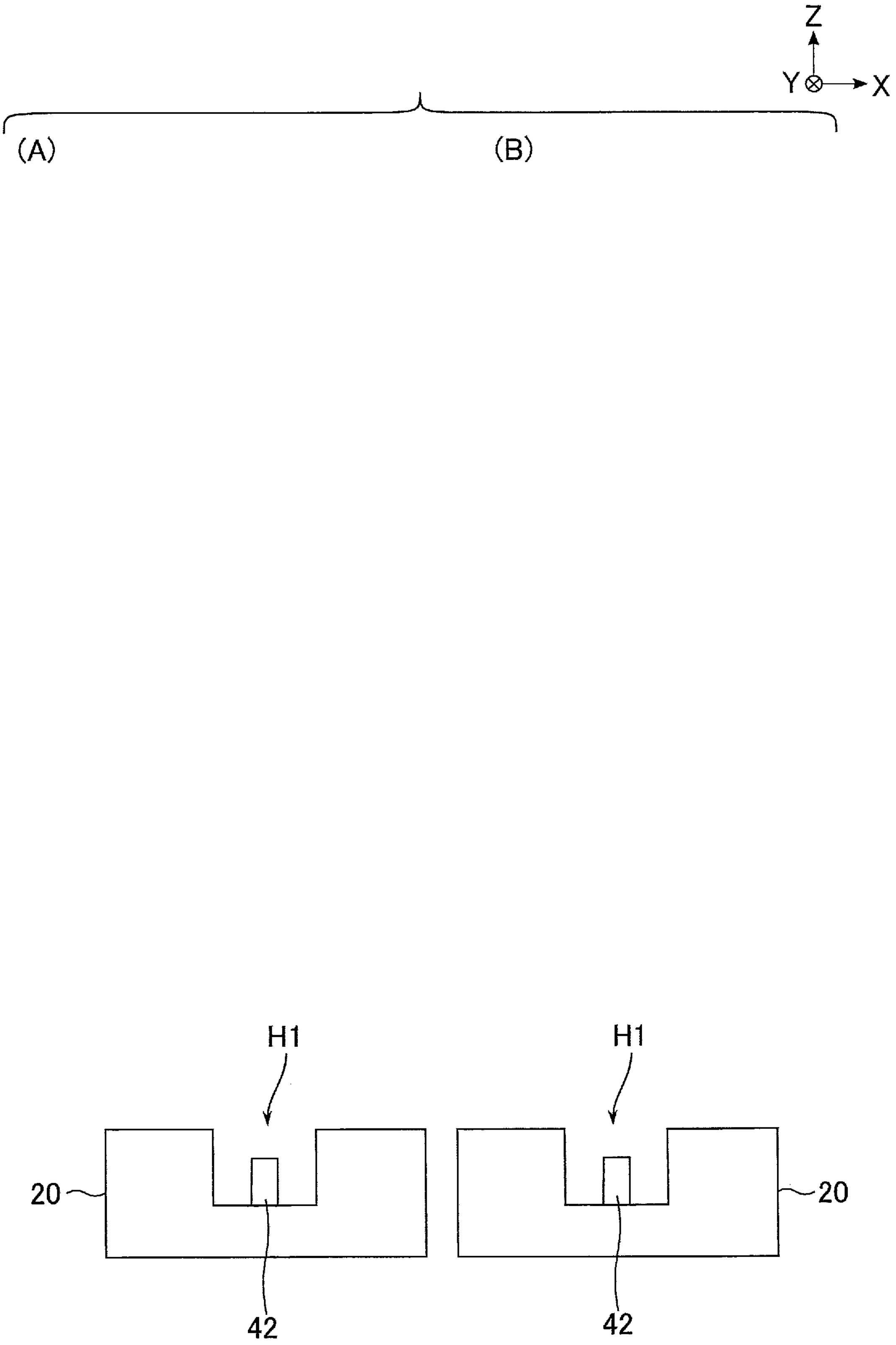
F I G. 15

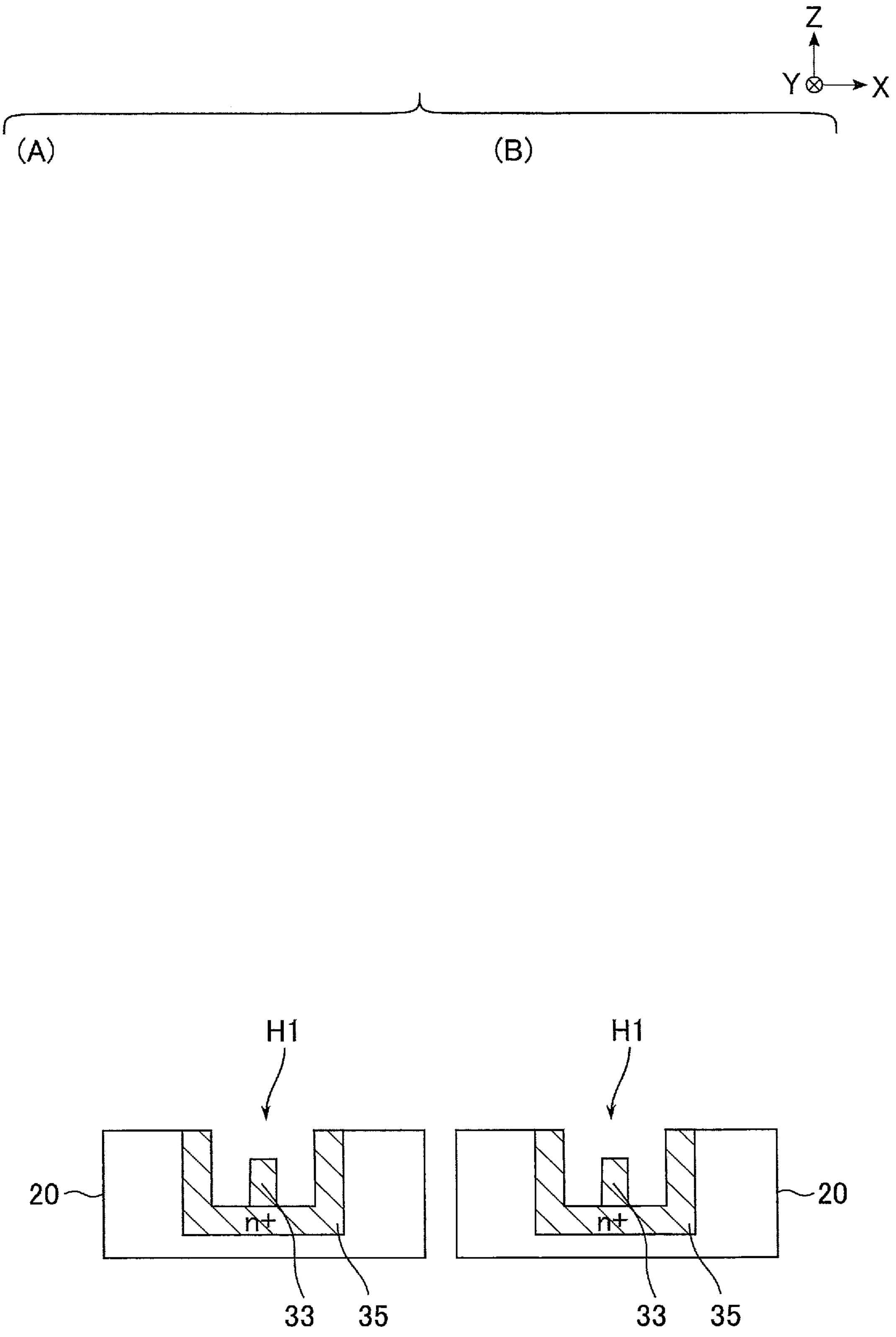
F I G. 16

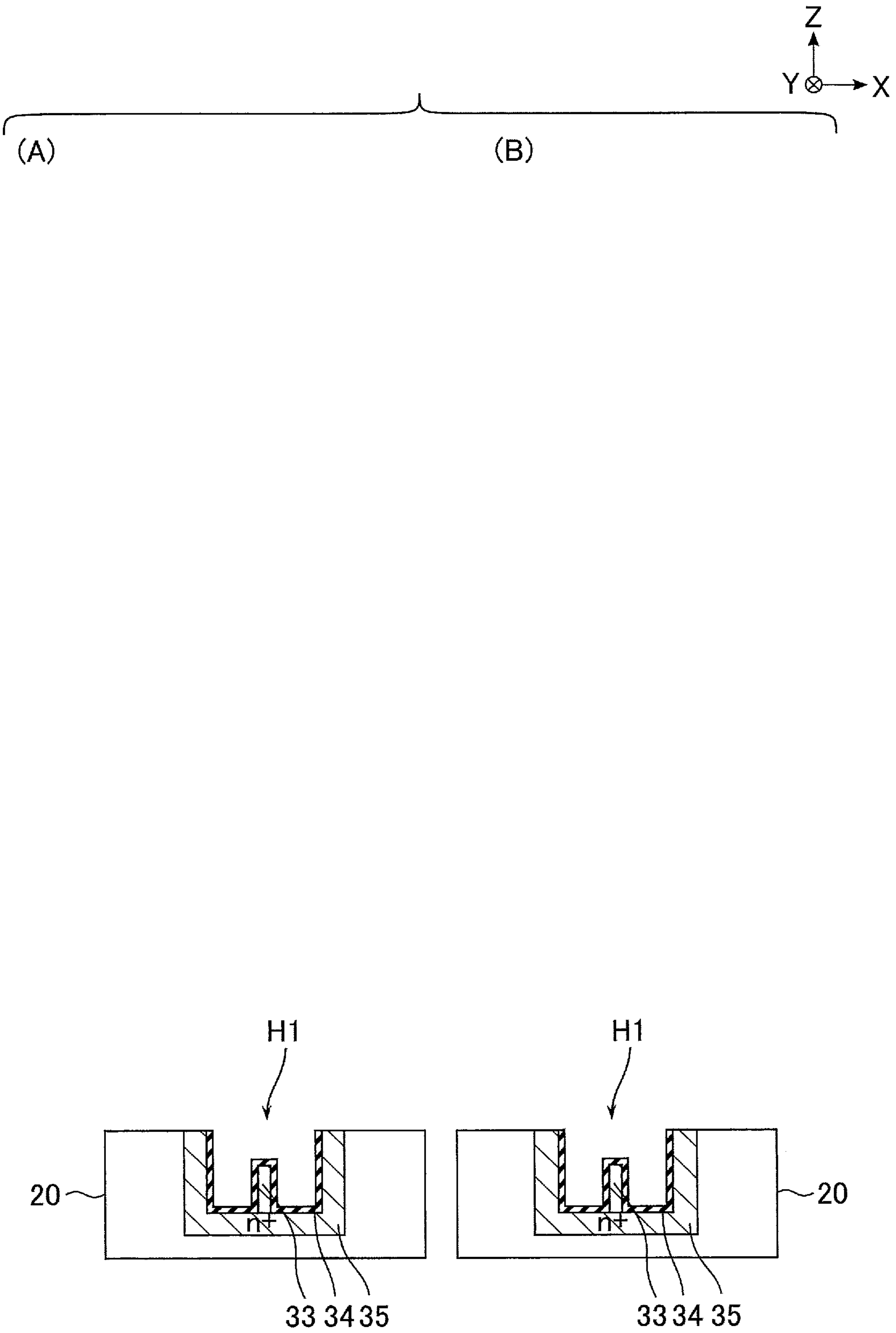
F I G. 17

F I G. 18

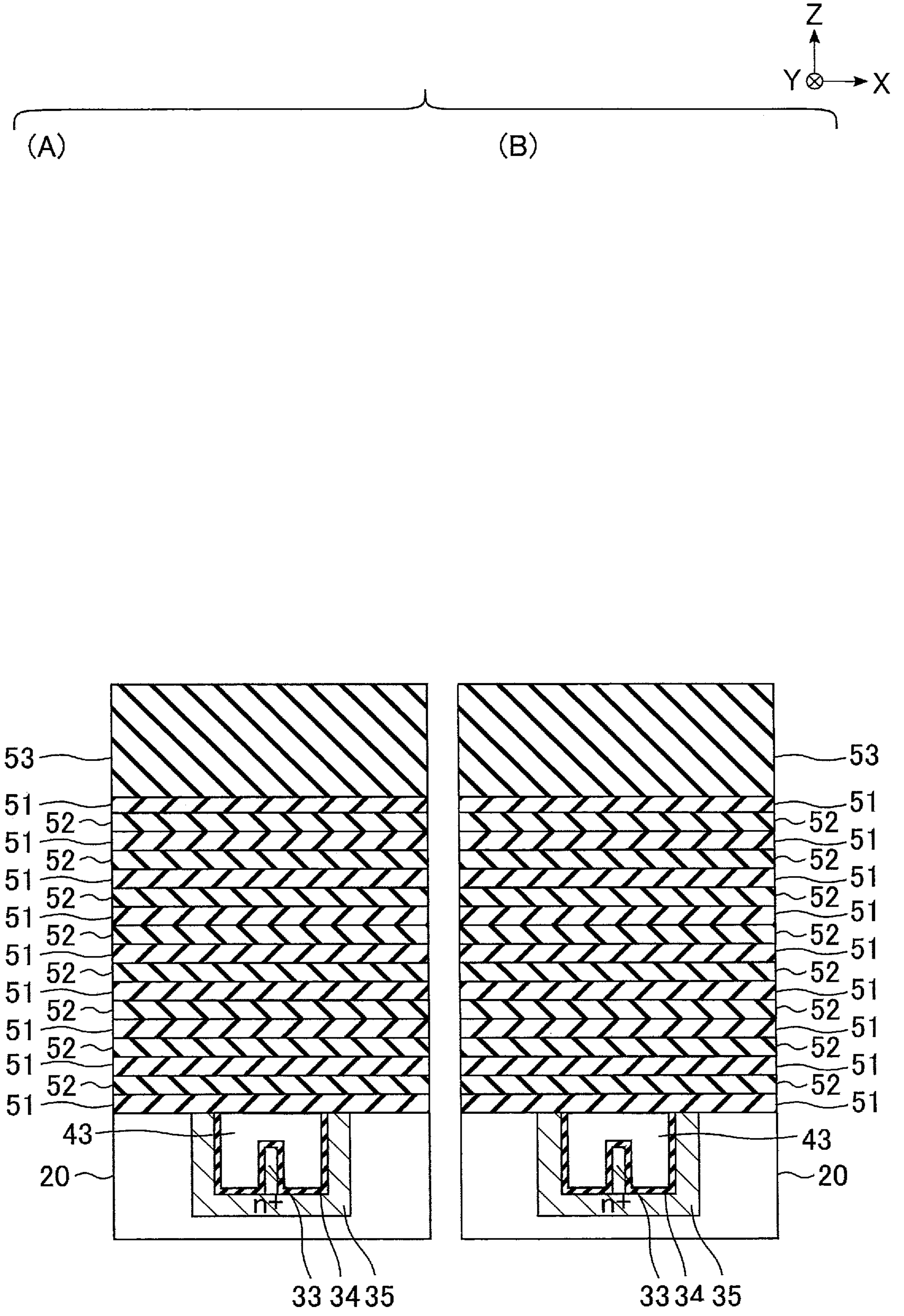
F I G. 19

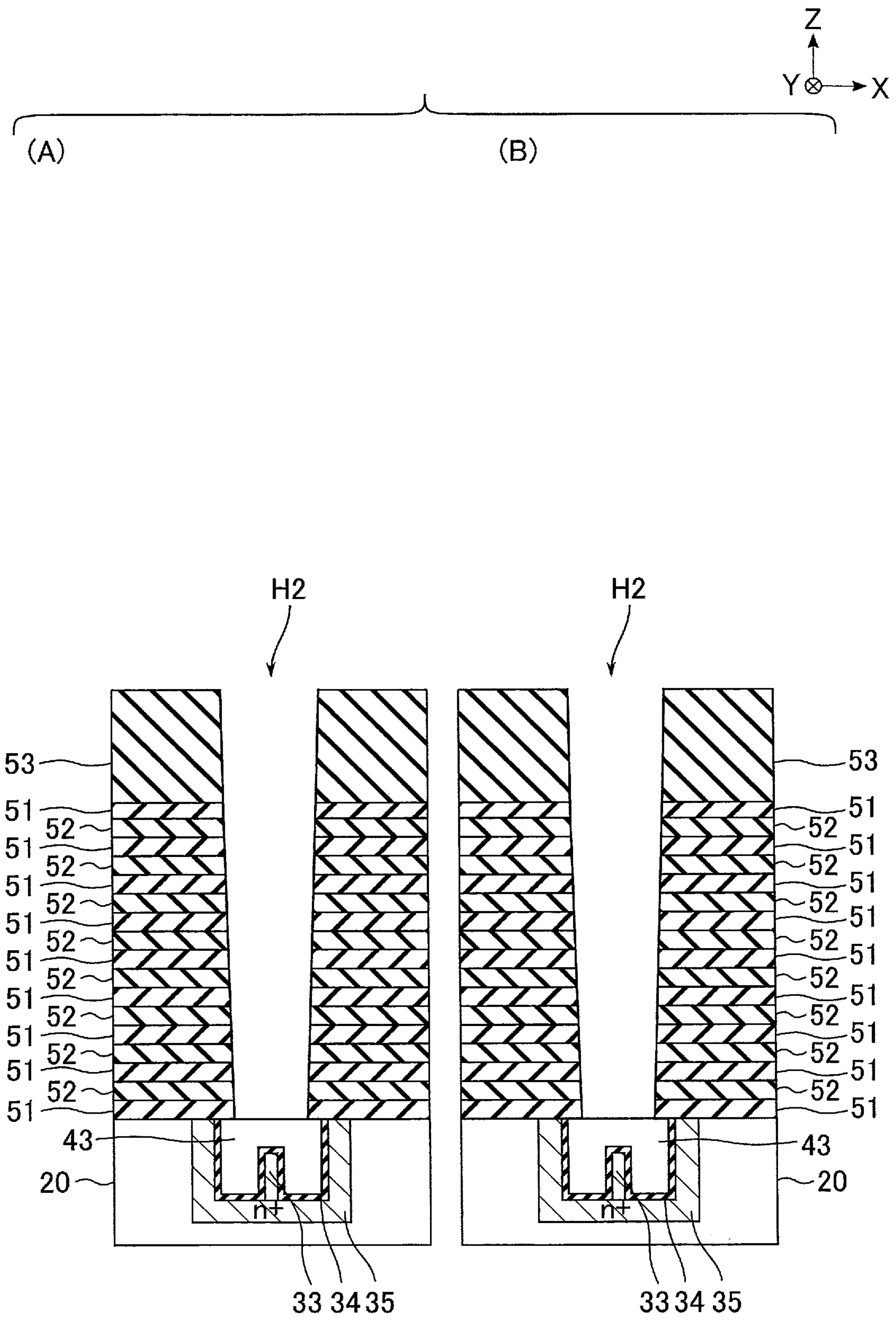
F I G. 20

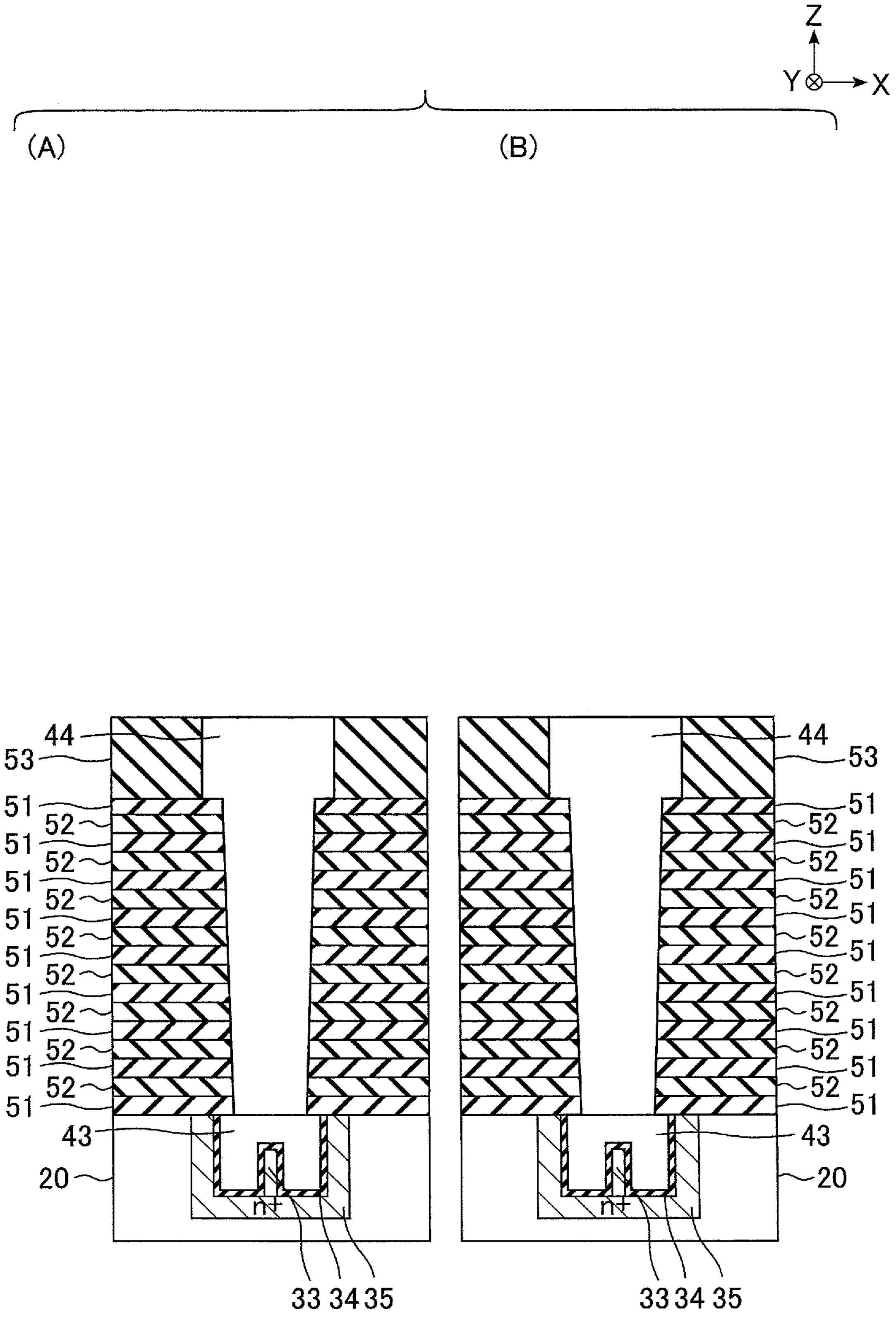
F I G. 21

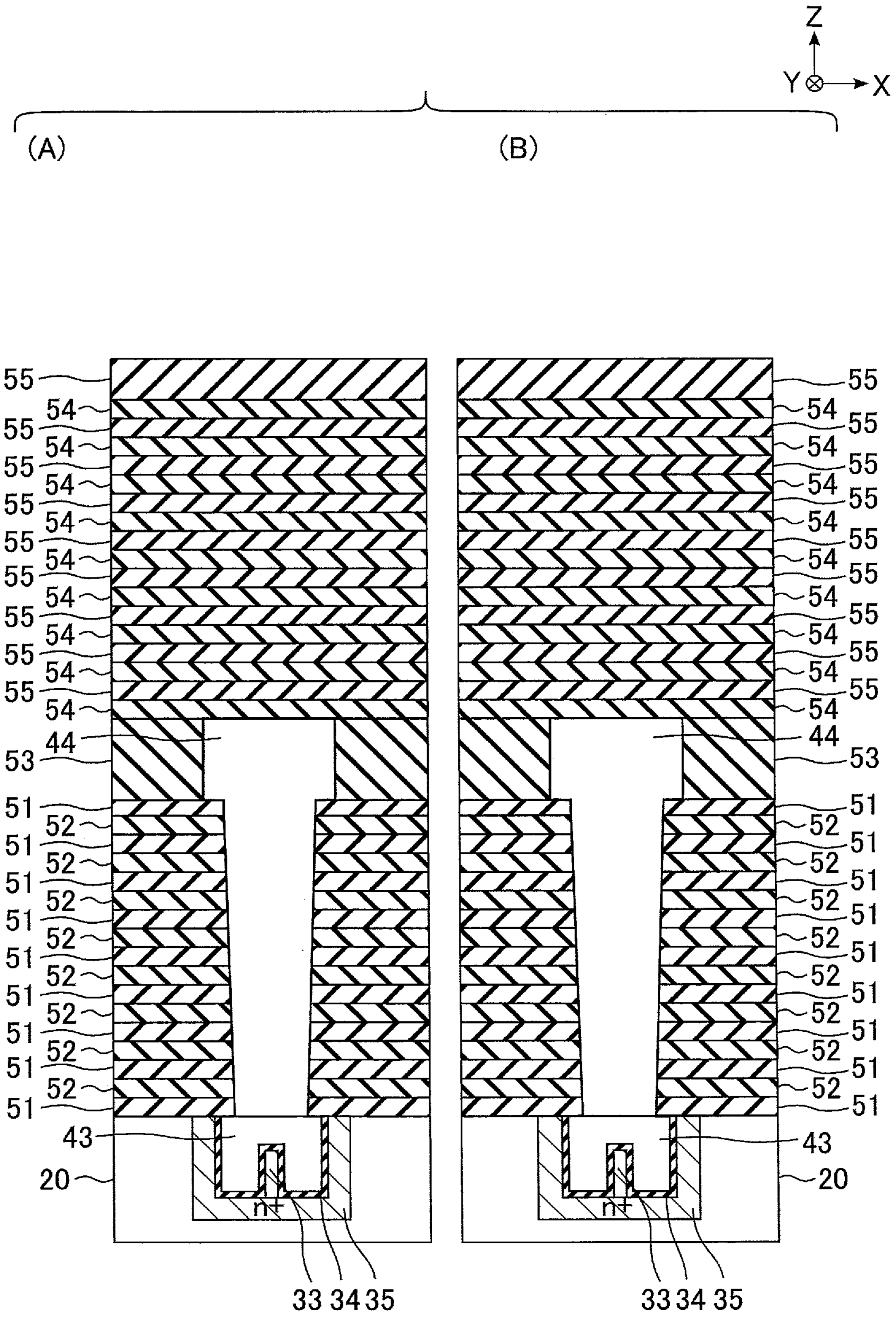
F I G. 22

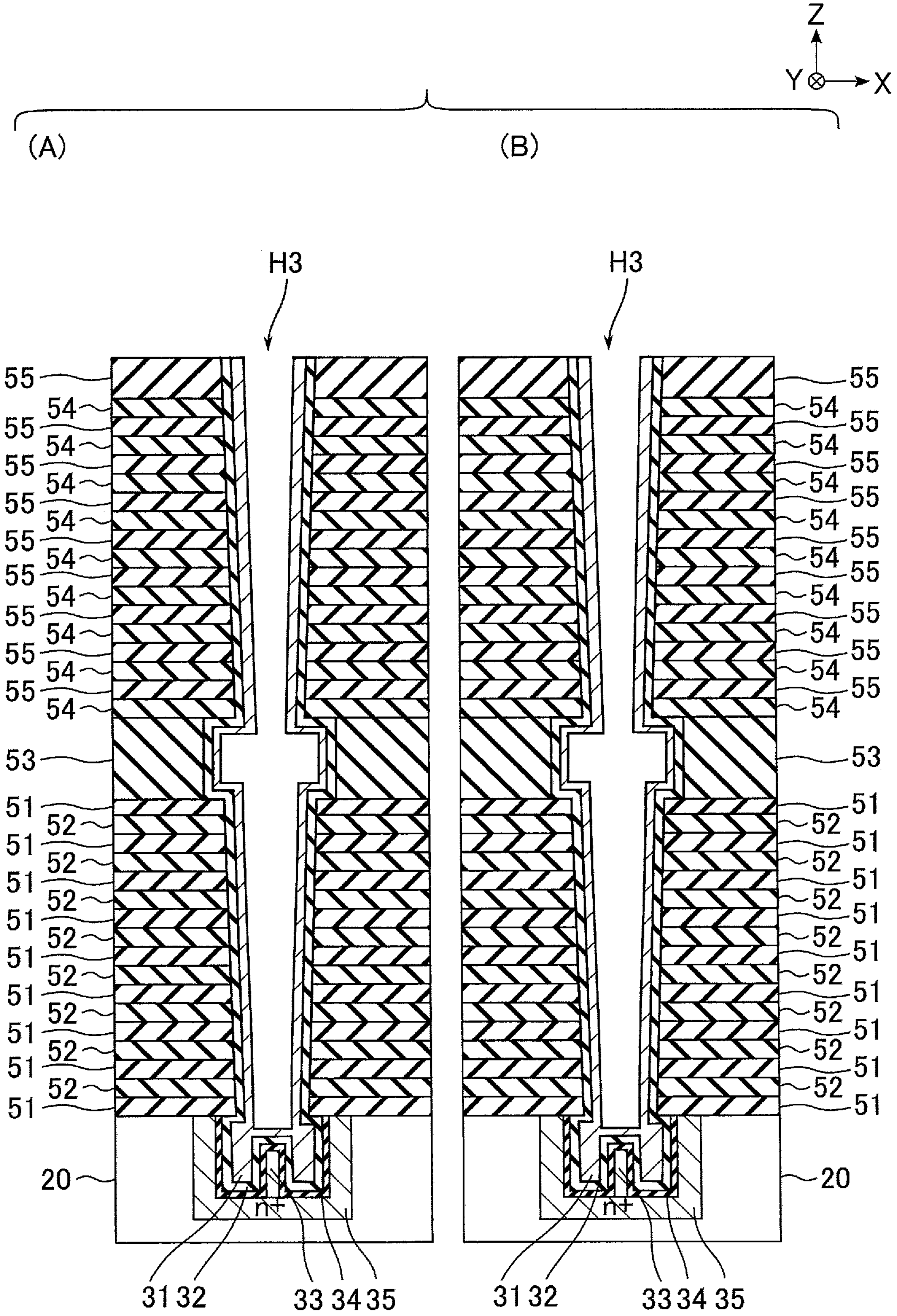
F I G. 24

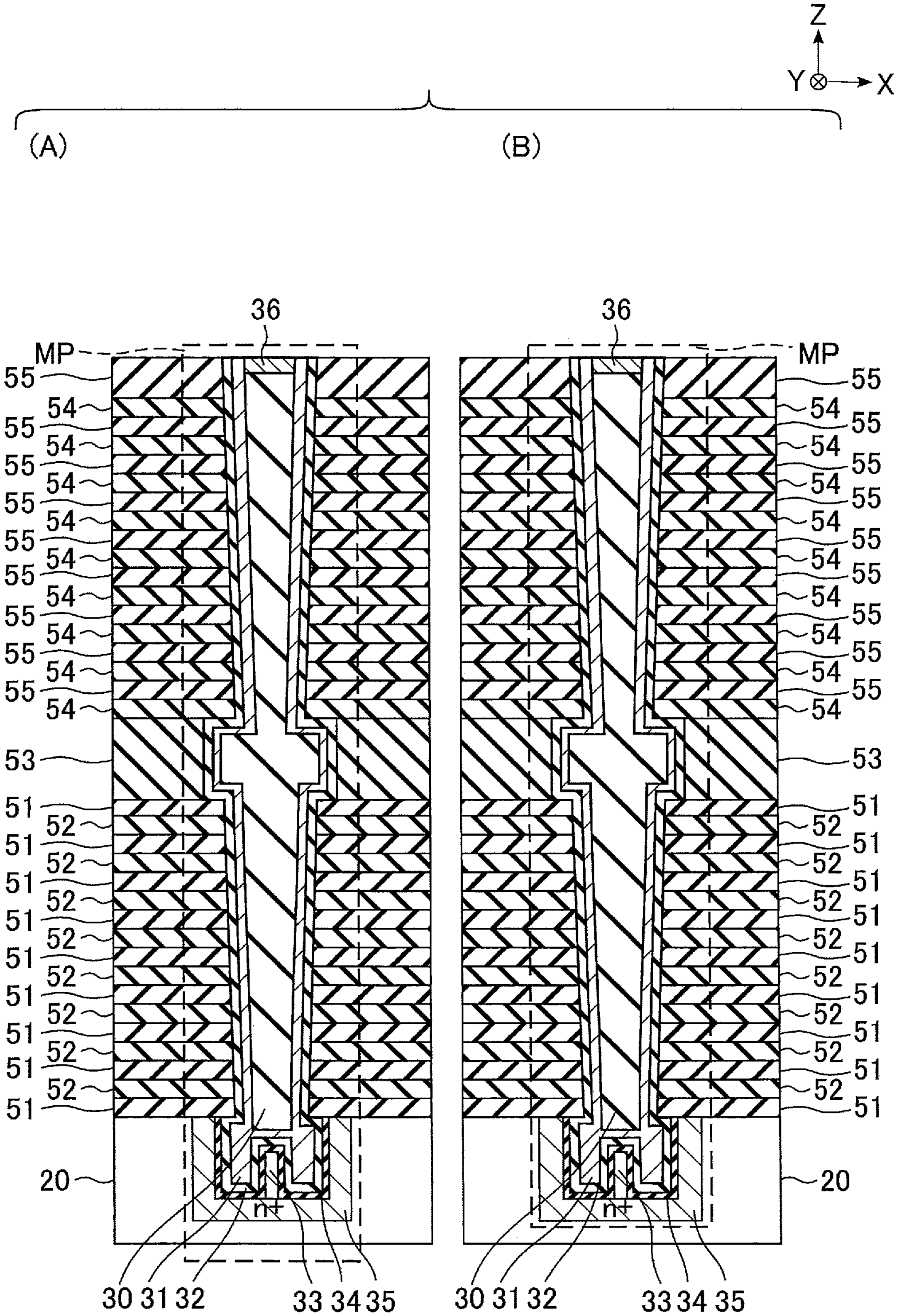
F I G. 25

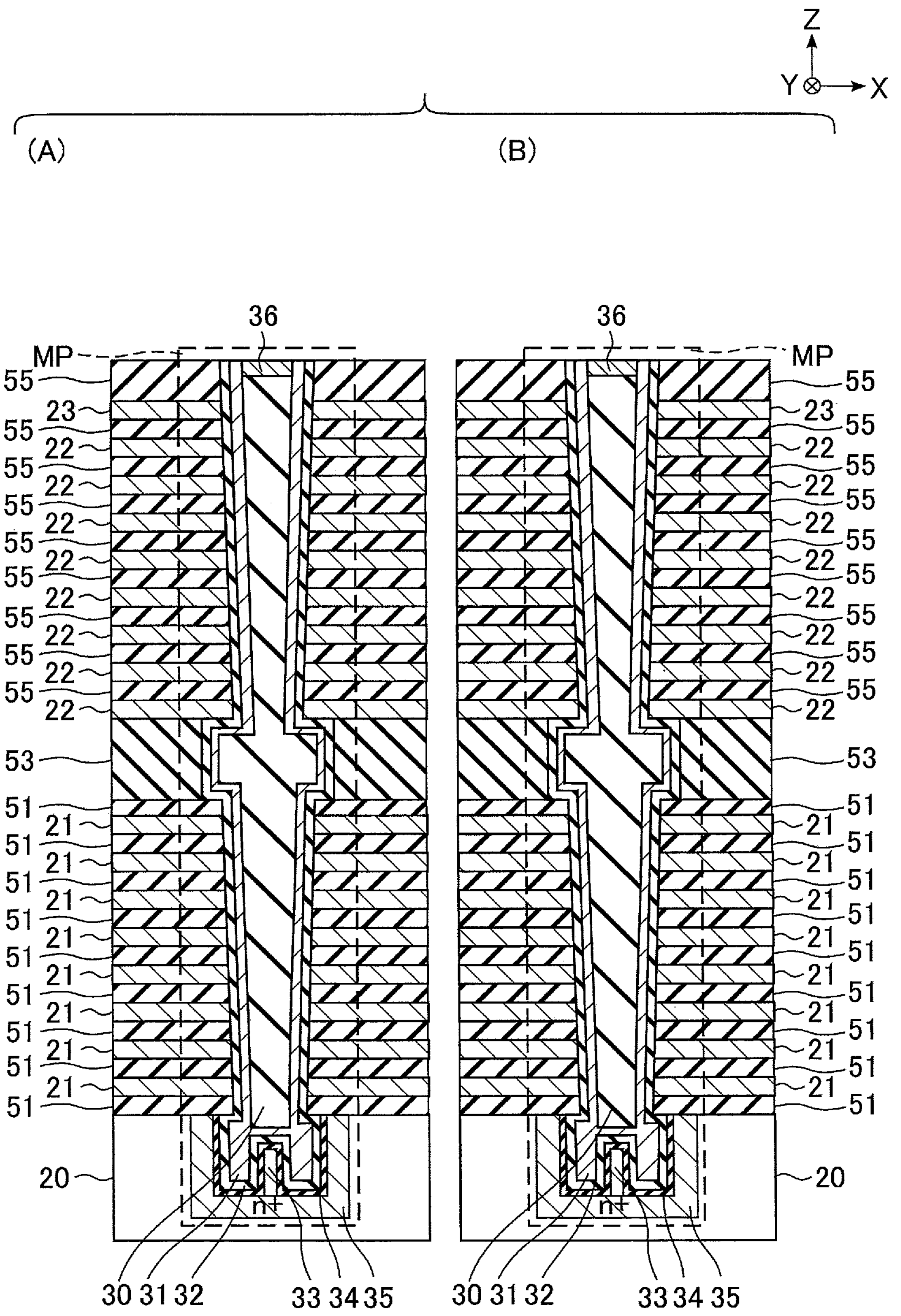
F I G. 26

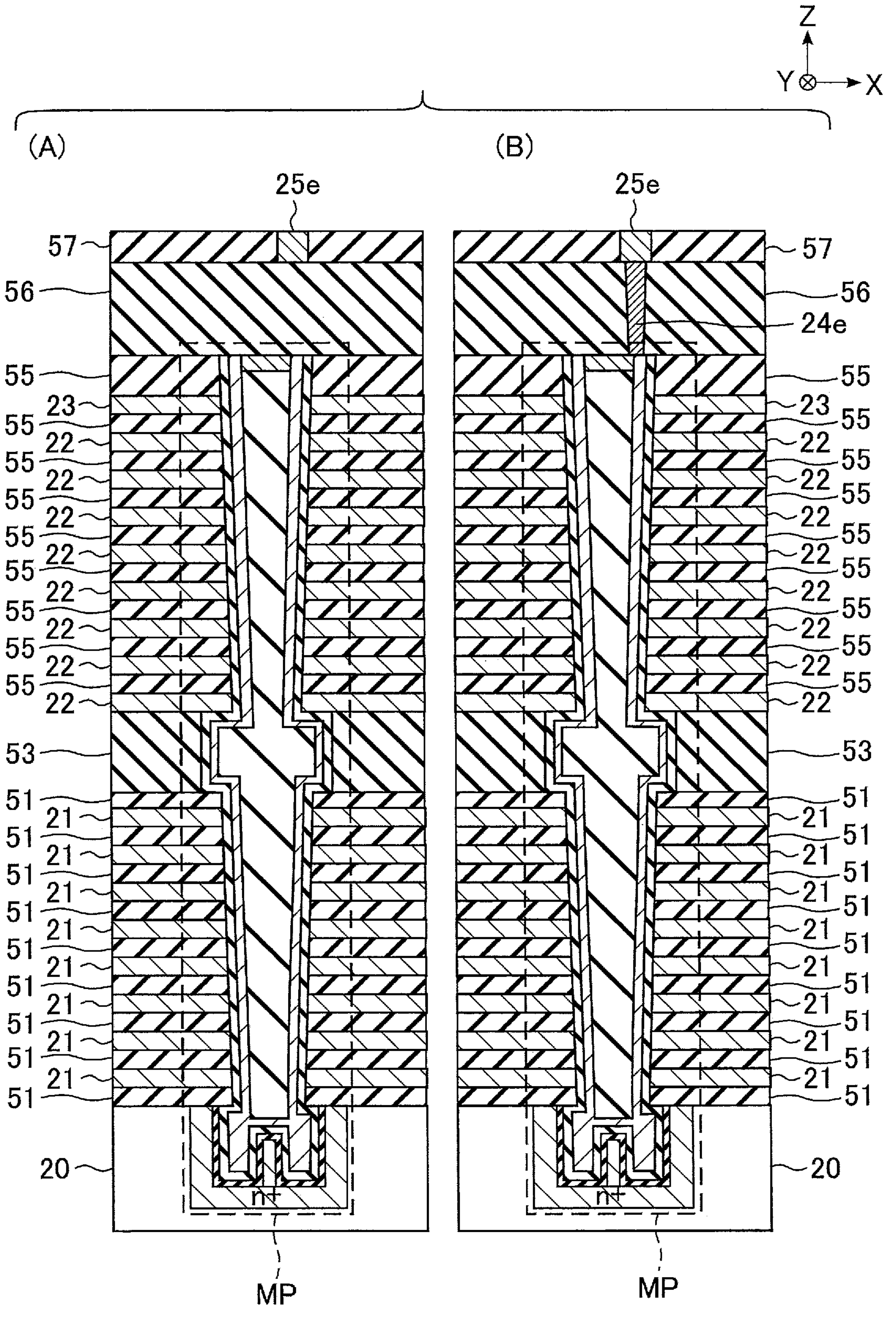
F I G. 27

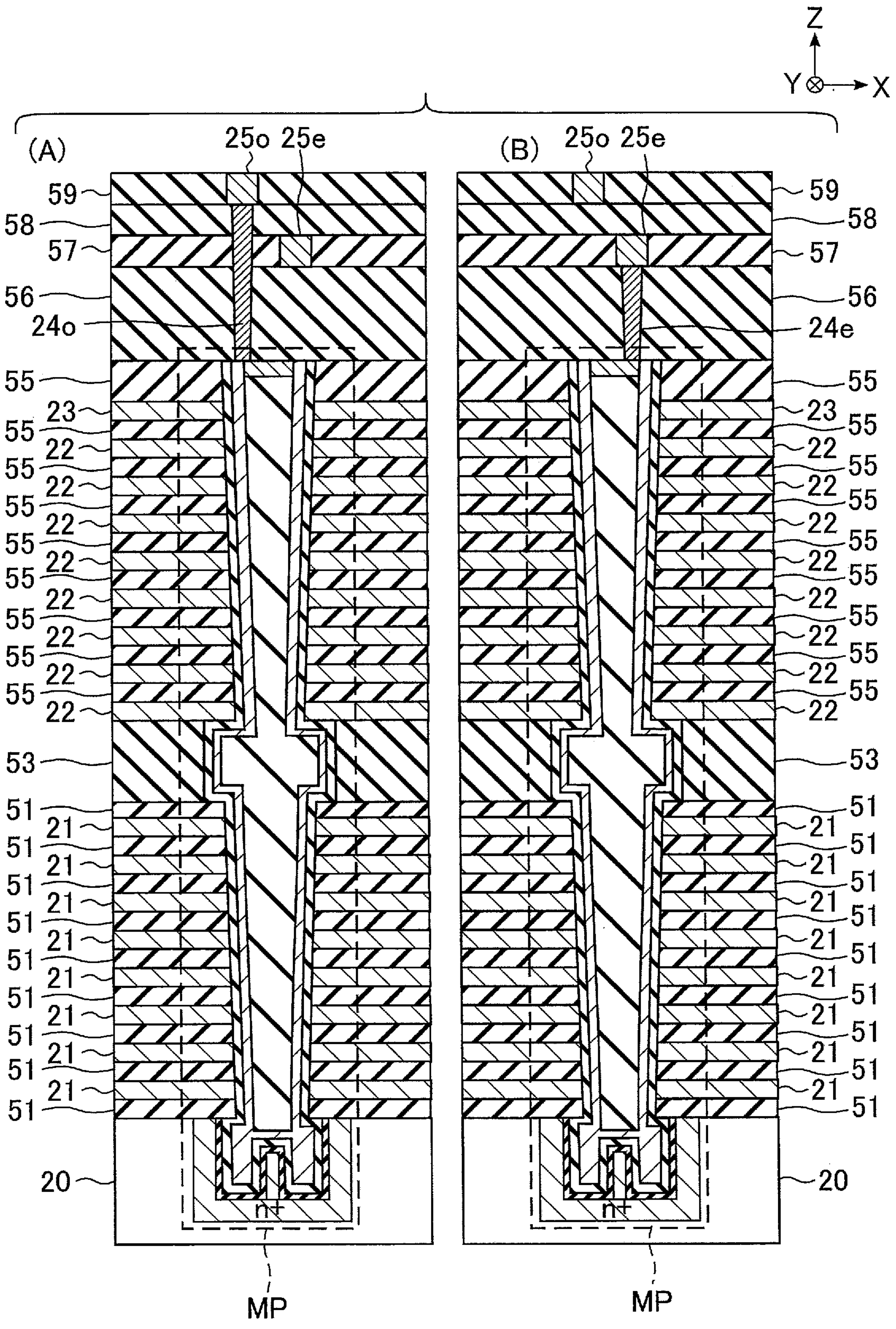
F I G. 28

SEMICONDUCTOR MEMORY DEVICE AND METHOD OF MANUFACTURING SEMICONDUCTOR MEMORY DEVICE

CROSS-REFERENCE TO RELATED APPLICATIONS

This application is a Continuation Application of PCT Application No. PCT/JP2020/009994, filed Mar. 9, 2020, the entire contents of which are incorporated herein by reference.

FIELD

Embodiments described herein relate generally to a semiconductor memory device and a method of manufacturing the semiconductor memory device.

BACKGROUND

A NAND flash memory is known as a semiconductor memory device capable of storing data non-volatilely. In a memory structure of the NAND flash memory, for example, a memory cell group (NAND string) including a plurality of memory cells coupled in series to a bit line from which data is read is arranged.

BRIEF DESCRIPTION OF THE DRAWINGS

FIG. 1 is a block diagram illustrating a configuration of a memory system including a semiconductor memory device according to an embodiment.

FIG. 2 is a circuit diagram illustrating a configuration of a memory cell array of the semiconductor memory device according to the embodiment.

FIG. 3 is a plan view illustrating a planar layout of the memory cell array of the semiconductor memory device according to the embodiment.

FIG. 5 is a cross-sectional view of a memory cell transistor, taken along line V-V of FIG. 4.

FIG. 9 is a timing chart illustrating a read operation in the semiconductor memory device according to the embodiment.

FIG. 10 is cross-sectional view of the memory cell array for illustrating a manufacturing step of the semiconductor memory device according to the embodiment.

FIG. 11 is cross-sectional view of the memory cell array for illustrating a manufacturing step of the semiconductor memory device according to the embodiment.

FIG. 12 is cross-sectional view of the memory cell array for illustrating a manufacturing step of the semiconductor memory device according to the embodiment.

FIG. 13 is cross-sectional view of the memory cell array for illustrating a manufacturing step of the semiconductor memory device according to the embodiment.

FIG. 14 is cross-sectional view of the memory cell array for illustrating a manufacturing step of the semiconductor memory device according to the embodiment.

FIG. 15 is cross-sectional view of the memory cell array for illustrating a manufacturing step of the semiconductor memory device according to the embodiment.

FIG. 16 is cross-sectional view of the memory cell array for illustrating a manufacturing step of the semiconductor memory device according to the embodiment.

FIG. 17 is cross-sectional view of the memory cell array for illustrating a manufacturing step of the semiconductor memory device according to the embodiment.

FIG. 18 is cross-sectional view of the memory cell array for illustrating a manufacturing step of the semiconductor memory device according to the embodiment.

FIG. 19 is cross-sectional view of the memory cell array for illustrating a manufacturing step of the semiconductor memory device according to the embodiment.

FIG. 20 is cross-sectional view of the memory cell array for illustrating a manufacturing step of the semiconductor memory device according to the embodiment.

FIG. 21 is cross-sectional view of the memory cell array for illustrating a manufacturing step of the semiconductor memory device according to the embodiment.

FIG. 22 is cross-sectional view of the memory cell array for illustrating a manufacturing step of the semiconductor memory device according to the embodiment.

FIG. 24 is cross-sectional view of the memory cell array for illustrating a manufacturing step of the semiconductor memory device according to the embodiment.

FIG. 25 is cross-sectional view of the memory cell array for illustrating a manufacturing step of the semiconductor memory device according to the embodiment.

FIG. 26 is cross-sectional view of the memory cell array for illustrating a manufacturing step of the semiconductor memory device according to the embodiment.

FIG. 27 is cross-sectional view of the memory cell array for illustrating a manufacturing step of the semiconductor memory device according to the embodiment.

FIG. 28 is cross-sectional view of the memory cell array for illustrating a manufacturing step of the semiconductor memory device according to the embodiment.

DETAILED DESCRIPTION

Figure 4:
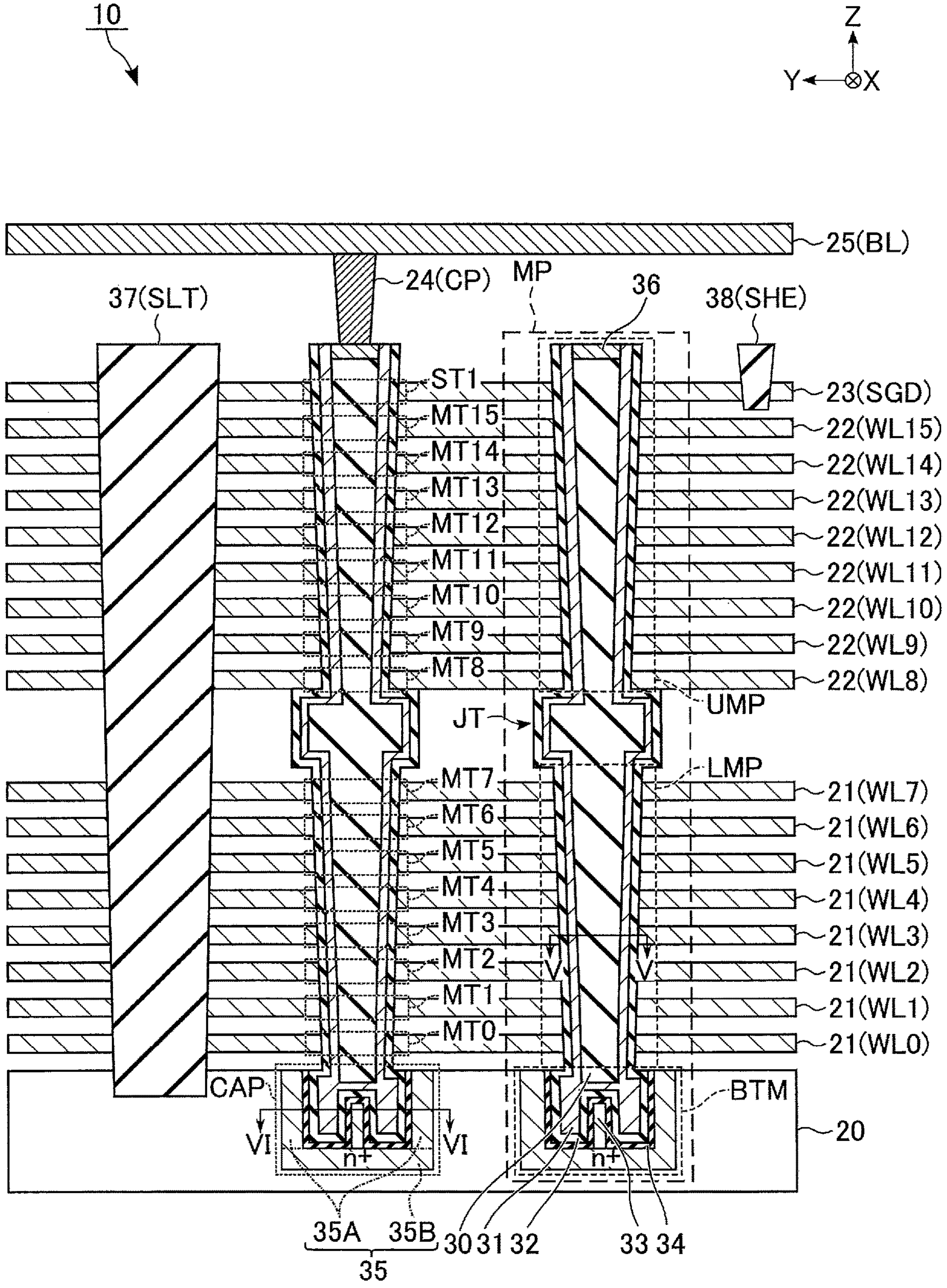
FIG. 4 is a cross-sectional view of the memory cell array, taken along line IV-IV of FIG. 3.

In general, according to one embodiment, a semiconductor memory device includes: a first bit line; a capacitor; and a first memory cell transistor and a second memory cell transistor that are coupled in series between the first bit line and the capacitor.

Hereinafter, embodiments will be described with reference to the accompanying drawings. Each embodiment is an example of a device or method that embodies a technical idea of the invention. The drawings are schematic or conceptual, and the dimensions and ratios, etc. in the drawings are not always the same as the actual ones. The technical ideas of the present invention are not limited by shapes, structures, or arrangements, etc. of the structural elements.

In the following description, structural components having substantially the same function and configuration will be denoted by the same reference symbol including characters or numbers. When the same elements referred to by the same reference symbol and having similar structures are to be distinguished, an additional character or number may be added to the reference symbol.

1. Embodiment

A semiconductor memory device according to one embodiment will be described.

1.1 Configuration

First, a configuration of the semiconductor memory device according to the embodiment will be described.

1.1.1 Semiconductor Memory Device

FIG. 1 is a block diagram illustrating a configuration of a memory system including a semiconductor memory device according to the embodiment. The semiconductor memory device 1 is a NAND flash memory capable of storing data non-volatilely, and is controlled by an external memory controller 2. Communications between the semiconductor memory device 1 and the memory controller 2 support, for example, NAND interface standards.

As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer greater than or equal to 1). The block BLK is a set of a plurality of memory cells that can store data non-volatilely, and is used as, for example, a data erase unit. A plurality of bit lines and a plurality of word lines are provided in the memory cell array 10. Each memory cell is associated with, for example, a single bit line and a single word line. A detailed configuration of the memory cell array 10 will be described later.

The command register 11 stores a command CMD that is received by the semiconductor memory device 1 from the memory controller 2. The command CMD includes an instruction to instruct, for example, the sequencer 13 to perform a read operation, a write operation, an erase operation, or the like.

The address register 12 stores address information ADD received by the semiconductor memory device 1 from the memory controller 2. The address information ADD includes, for example, a block address BA, a page address PA, and a column address CA. For example, the block address BA, the page address PA, and the column address CA are used to select a block BLK, a word line, and a bit line, respectively.

The sequencer 13 controls the entire operation of the semiconductor memory device 1. For example, the sequencer 13 controls the driver module 14, the row decoder module 15, the sense amplifier module 16, etc., based on the command CMD stored in the command register 11, to perform a read operation, a write operation, an erase operation, etc.

The driver module 14 generates voltages for use in the read operation, the write operation, the erase operation, etc. Then, the driver module 14 applies a generated voltage to a signal line corresponding to a selected word line based on, for example, a page address PA stored in the address register 12.

Based on the block address BA stored in the address register 12, the row decoder module 15 selects one corresponding block BLK in the memory cell array 10. The row decoder module 15 transfers, for example, the voltage applied to the signal line, corresponding to the selected word line, to the selected word line in the selected block BLK.

The sense amplifier module 16, in a write operation, applies a desired voltage to each bit line in accordance with write data DAT received from the memory controller 2. In a read operation, the sense amplifier module 16 determines data stored in a memory cell based on the voltage of the bit line, and transfers the determination result to the memory controller 2 as the data DAT.

The semiconductor memory device 1 and the memory controller 2 as described above may be combined to constitute one semiconductor device. Examples of such semiconductor devices include a memory card such as an SD™ card, and a solid state drive (SSD).

1.1.2 Circuit Configuration of Memory Cell Array

FIG. 2 is a circuit diagram illustrating a configuration of the memory cell array of the semiconductor memory device according to the embodiment. In FIG. 2, one block BLK of a plurality of blocks BLK included in the memory cell array 10 is shown.

As illustrated in FIG. 2, the block BLK includes, for example, four string units SU0 to SU3. Each string unit SU includes a plurality of NAND strings NS that are respectively associated with bit lines BL1, BL2, BL(2*m*−1), and BL (2*m*) (m is an integer greater than or equal to 1). In the explanations below, the bit lines BL(2*k*−1) and BL(2*k*) (1≤k≤m) are also referred to as the bit lines BLko and BLke, respectively, to distinguish them from each other when necessary. The bit lines BL1*o* to BLmo are also referred to as the bit lines BLo, when they do not have to be distinguished, and the bit lines BL1*e* to BLme are also referred to as the bit lines BLe, when they do not have to be distinguished.

Each NAND string NS includes, for example, memory cell transistors MT0 to MT15, a select transistor ST, and a capacitor CAP. Each memory cell transistor MT includes a control gate and a charge storage film, and stores data non-volatilely. The select transistor ST is used to select a string unit SU in various operations. The capacitor CAP interrupts a current flowing in the NAND string NS, and shares a charge with a bit line BL, for example, in the read operation.

In each NAND string NS, the memory cell transistors MT0 to MT15 are coupled in series. The drain of the select transistor ST is coupled to an associated bit line BL, and the source of the select transistor ST is coupled to a first end of the memory cell transistors MT0 to MT15, which are coupled in series. A first end of the capacitor CAP is coupled to a second end of the memory cell transistors MT0 to MT15 coupled in series. A second end of the capacitor CAP is coupled to a source line SL. The source line SL may be coupled to a source line driver (not shown), so that it is configured to be controllable at a predetermined voltage (for example, a ground voltage). The source line SL may be in a floating state without being subjected to a voltage control by the source line driver or the like.

In the same block BLK, the control gates of the memory cell transistors MT0 to MT15 are respectively coupled in common to word lines WL0 to WL15. The gates of select transistors ST respectively included in the string units SU0 to SU3 are respectively coupled in common to select gate lines SGD0 to SGD3.

In the above-described circuit configuration of the memory cell array 10, a bit line BL is shared by the NAND strings NS to which the same column address is assigned in the respective string units SU. The source line SL is, for example, shared by a plurality of blocks BLK.

A set of memory cell transistors MT coupled to a common word line WL in a single string unit SU is referred to as, for example, a cell unit CU. For example, the storage capacity of the cell unit CU including memory cell transistors MT, which individually store 1-bit data, is defined as "1-page data". The cell unit CU may have a storage capacity of 2 or more pages of data, according to the number of bits of data stored in the memory cell transistor MT.

The circuit configuration of the memory cell array 10 included in the semiconductor memory device 1 according to the present embodiment is not limited to the configuration described above. For example, the numbers of the memory cell transistors MT and the select transistors ST included in each NAND string NS may be any numbers. The number of the string units SU included in each block BLK may be determined as appropriate.

1.1.3 Configuration of Memory Cell Array

An exemplary structure of the memory cell array in the semiconductor memory device according to the embodiment will be explained below.

In the drawings mentioned below, the X axis corresponds to the extending direction of the word lines WL, the Y axis corresponds to the extending direction of the bit lines BL, and the Z axis corresponds to the extending direction perpendicular to the surface of a semiconductor substrate which is used for the formation of the semiconductor memory device 1. In the plan view, hatching is applied as appropriate for better viewability. The hatching applied to the plan view is not necessarily related to the materials or characteristics of the structural element to which the hatching is applied. In the cross-sectional views, structural components such as insulating layers (interlayer insulating films), interconnects, contacts, etc. are omitted, where not necessary, for better viewability.

FIG. 3 is a plan view illustrating a planar layout of the memory cell array of the semiconductor memory device according to the embodiment. FIG. 3 illustrates a part of a region including a structure corresponding to the string units SU0 to SU3 in a block BLK, as an example.

As illustrated in FIG. 3, the memory cell array 10 includes, for example, slits SLT and SHE, memory pillars MP, contacts CP (CPo and CPe), and bit lines BL (BLo and BLe).

The slits SLT, each extending in the X direction, are arranged alongside each other in the Y direction. The slits SHE, each extending in the X direction, are arranged alongside each other in the Y direction between the adjacent slits SLT. The slit SLT is, for example, wider than the slit SHE. Each of the slits SLT and SHE includes an insulator. The slit SLT divides an interconnect layers corresponding to word lines WL and an interconnect layer corresponding to a select gate line SGD, for example. The slit SHE divides the interconnect layer corresponding to the select gate line SGD.

The region separated by the slits SLT and SHE corresponds to one string unit SU. Specifically, for example, the string units SU0 to SU3 are provided, for example, between slits SLT adjacent in the Y direction. Four regions separated by the three slits SHE between the slits SLT correspond respectively to the string units SU0 to SU3. A plurality of memory pillars MP are, for example, in a 16-row staggered arrangement in the Y direction in the region between adjacent slits SLT. In the example of FIG. 3, the memory pillars MP are in a 4-row staggered arrangement in the Y direction in a single string unit SU. In the memory cell array 10, for example, a similar layout is repeatedly arranged in the Y direction.

The bit lines BL each extend in the Y direction, and the bit lines BLo and BLe are alternately arranged alongside each other in the X direction. A set of a single bit line BLe and a single bit line BLo is arranged so as to overlap two common memory pillars MP in each string unit SU in the plan view. The bit line BLo is coupled to, in each string unit SU, one of the two memory pillars MP overlapping the bit line in the plan view via the contact CPo. The bit line BLe is coupled to, in each string unit SU, the other of the two memory pillars MP overlapping the bit line in the plan view via the contact CPe. A conductor path formed in the memory pillar MP is electrically coupled to the corresponding bit line BL via the contact CP.

The planar layout of the memory cell array 10 described above is merely an example, and is not limited thereto. For example, the number of slits SHE that are arranged between the adjacent slits SLT may be determined as appropriate. The number of string units SU between the adjacent slits SLT varies based on the number of slits SHE. The number of memory pillars MP and the arrangement thereof may be determined as appropriate. The number of bit lines BL overlapping each memory pillar MP may be determined as appropriate.

FIG. 4 is a cross-sectional view taken along line IV-IV in FIG. 3, which illustrates an example of the cross-sectional structure of the memory cell array 10. As illustrated in FIG. 4, the memory cell array 10 includes, for example, conductive layers 21 to 25 provided above a semiconductor substrate 20.

Specifically, above the semiconductor substrate 20, a layer stack formed of insulating layers (not shown) and conductive layers 21 alternately stacked is provided. For example, the conductive layers 21 are used as word lines WL0 to WL7 in the order from the side of the semiconductor substrate 20.

Above the uppermost conductive layer 21, a layer stack formed of insulating layers (not shown) and conductive layers 22 alternately stacked is provided. For example, the conductive layers 22 are used as word lines WL8 to WL15 in the order from the side of the semiconductor substrate 20.

The interval between the uppermost conductive layer 21 and the lowermost conductive layer 22 in the Z direction can be longer than the interval between two adjacent conductive layers 21 and the interval between two adjacent conductive layers 22 in the Z direction. In other words, the insulating layer between the uppermost conductive layer 21 and the lowermost conductive layer 22 is thicker in the Z direction than the insulating layer between two adjacent conductive layers 21 and the insulating layer between two adjacent conductive layers 22.

The conductive layer 23 is provided above the uppermost conductive layer 22, with an insulating layer (not shown) interposed therebetween. The conductive layer 23 is used as a select gate line SGD.

The conductive layers 21 to 23 are formed in a plate shape, for example, extending along the XY plane and include tungsten (W).

The conductive layer 25 is provided above the conductive layer 23, with an insulating layer (not shown) interposed therebetween. For example, the conductive layer 25 extends in the Y direction, and a plurality thereof are arranged alongside each other in lines in the X direction, and are used as bit lines BL. The conductive layer 25 includes copper (Cu), for example.

The memory pillar MP extends in the Z direction, passes through the conductive layers 21 to 23, and its bottom reaches a portion below the upper surface of the semiconductor substrate 20. The memory pillar MP includes a lower pillar LMP, an upper pillar UMP, a joint portion JT coupling the lower pillar LMP and the upper pillar UMP, and a bottom portion BTM formed in the semiconductor substrate 20 and coupled to the lower pillar LMP.

The joint portion JT is formed in a part of the memory pillar MP between the uppermost conductive layer 21 and the lowermost conductive layer 22. A top end of the lower pillar LMP is coupled to a bottom end of the joint portion JT above an upper surface of the uppermost conductive layer 21, and a bottom end of the upper pillar UMP is coupled to a top end of the joint portion JT below a lower surface of the lowermost conductive layer 22. The joint portion JT may include a portion having a diameter greater than a maximum value of a diameter of the lower pillar LMP and a maximum value of a diameter of the upper pillar UMP.

A bottom surface and a side surface of the bottom portion BTM are covered by an $n^+$-type impurity diffusion region 35 formed in the semiconductor substrate 20. A top end of the bottom portion BTM reaches the upper surface of the semiconductor substrate 20, and is brought into contact with a bottom end of the lower pillar LMP. A diameter of the top end of the bottom portion BTM is, for example, greater than a diameter of the bottom end of the lower pillar LMP.

The memory pillar MP includes, for example, a core member 30, a semiconductor film 31, a film stack 32, an $n^+$-type impurity diffusion region 33, an insulating film 34, an $n^+$-type impurity diffusion region 35, and a semiconductor portion 36. The core member 30, the semiconductor film 31, and the film stack 32 are each formed as a continuous film in the bottom portion BTM, the lower pillar LMP, the joint portion JT, and the upper pillar UMP. The insulating film 34 is formed as a continuous film in the bottom portion BTM.

Specifically, the core member 30, extending along the Z axis, is provided in an approximately central portion of the memory pillar MP. A top end of the core member 30 is located, for example, above the conductive layer 23, and a bottom end is located, for example, below the lowermost conductive layer 21. The core member 30 includes an insulator, such as silicon oxide ($SiO_2$).

The semiconductor film 31 covers a bottom surface and a side surface of the core member 30. A bottom end of the semiconductor film 31 is located, for example, below the upper surface of the semiconductor substrate 20, and a top end of the semiconductor film 31 is located, for example, in a layer above the conductive layer 23. The semiconductor film 31 includes a cylindrical portion formed to surround the side surface of the core member 30 along the Z axis, in the lower pillar LMP, the joint portion JT, and the upper pillar UMP, and a cylindrical portion formed between the $n^+$-type impurity diffusion region 33 and the $n^+$-type impurity diffusion region 35 in the bottom portion BTM. The semiconductor film 31 includes, for example, polysilicon.

The film stack 32 covers a bottom surface and a side surface of the semiconductor film 31. Details of the configuration of the film stack 32 will be described later.

The insulating film 34 covers a bottom surface and a side surface of the film stack 32 in the bottom portion BTM, and includes, for example, silicon oxide. The film stack 32 and the insulating film 34 are provided between the semiconductor film 31 and the $n^+$-type impurity diffusion region 33 and between the semiconductor film 31 and the type impurity diffusion region 35 in the bottom portion BTM.

The $n^+$-type impurity diffusion regions 33 and 35 are semiconductors including an n-type impurity, such as phosphorus (P), and provided between the semiconductor substrate 20 and the insulating film 34.

The $n^+$-type impurity diffusion region 35 includes a portion 35A located above the bottom end of the semiconductor film 31, and a portion 35B located below the bottom end of the semiconductor film 31. As compared to the $n^+$-type impurity diffusion region 33, the portion 35A of the $n^+$-type impurity diffusion region 35 is provided in a position farther from the center of the memory pillar MP.

The $n^+$-type impurity diffusion region 33 is located above the bottom end of the semiconductor film 31, and at an approximately central portion of the memory pillar MP. The $n^+$-type impurity diffusion region 33 is in contact with a portion 35B of the $n^+$-type impurity diffusion region 35, and is separated from the portion 35A.

The semiconductor portion 36 covers the upper surface of the core member 30, and is in contact with an inner wall portion of the semiconductor film 31 above the core member 30. The semiconductor portion 36 has, for example, a columnar shape, and reaches the top end of the upper pillar UMP.

On the upper surface of the semiconductor film 31 and the semiconductor portion 36 in the memory pillar MP, a conductive layer 24 that functions as a columnar contact CP is provided. The conductive layer 24 includes, for example, tungsten (W). The cross-sectional view of FIG. 4 illustrates a contact CP corresponding to one memory pillar MP of the two memory pillars MP. In the other memory pillar MP on which no contact CP is shown, the contact CP is provided in a cross section in back or in front in the depth direction of the plane of paper of FIG. 4. An upper surface of each contact CP is in contact with and electrically coupled to the corresponding one conductive layer 25 (bit line BL).

The insulating layer 37 is formed in, for example, a plate shape extending along the XZ plane and functions as a slit SLT that divides the conductive layers 21 to 23 along the Y axis. The insulating layer 37 divides the conductive layers 21 to 23 into blocks BLK for example. A top end of the insulating layer 37 is located between the conductive layer 23 and the conductive layer 25, and a bottom end of the insulating layer 37 is located below the lowermost conductive layer 21. The insulating layer 37 includes an insulator such as silicon oxide ($SiO_2$).

The insulating layer 38 is formed in, for example, a plate shape extending along the XZ plane and functions as a slit SHE that divides the conductive layer 23 along the Y direction. The insulating layer 38 divides the conductive layer 23 into string units SU for example. A top end of the insulating layer 38 is located between the conductive layer 23 and the conductive layer 25, and a bottom end of the insulating layer 38 is located, for example, between the conductive layer 23 and the uppermost conductive layer 22. The insulating layer 38 includes an insulator such as silicon oxide ($SiO_2$).

Next, a cross-sectional structure of the lower pillar LMP and the upper pillar UMP along the XY plane will be explained with reference to FIG. 5.

FIG. 5 is a cross-sectional view taken along line V-V of FIG. 4, and illustrates an example of a cross-sectional structure of the lower pillar LMP. Since the cross-sectional structure of the upper pillar UMP is the same as that of the lower pillar LMP, the explanations of the former are omitted.

As illustrated in FIG. 5, the core member 30 is provided in a central portion of the lower pillar LMP, the semiconductor film 31 surrounds the side surface of the core member 30, and the film stack 32 surrounds the side surface of the semiconductor film 31. The film stack 32 includes, for example, a tunnel insulating film 32*a*, a charge storage film 32*b*, and a block insulating film 32*c*.

The tunnel insulating film 32*a* covers the side surface of the semiconductor film 31; the charge storage film 32*b* covers a side surface of the tunnel insulating film 32*a*; and the block insulating film 32*c* covers a side surface of the charge storage film 32*b*. The conductive layer 21 surrounds a side surface of the block insulating film 32*c*. The tunnel insulating film 32*a* and the block insulating film 32*c* each include silicon oxide for example, and the charge storage film 32*b* includes silicon nitride (SiN), for example.

With the configuration described above, portions of the lower pillar LMP that intersect the conductive layers 21 can function as the memory cell transistors MT0 to MT7. Similarly, in the upper pillar UMP, portions of the upper pillar UMP that intersect the conductive layers 22 can function as the memory cell transistors MT8 to MT15, and a portion that intersects the conductive layer 23 can function as the select transistor ST. In other words, the semiconductor film 31 is used as a channel of each of the memory cell transistors MT and the select transistor ST, in the lower pillar LMP and the upper pillar UMP.

Next, a cross-sectional structure of the bottom portion BTM along the XY plane will be explained with reference to FIG. 6.

Figure 6:
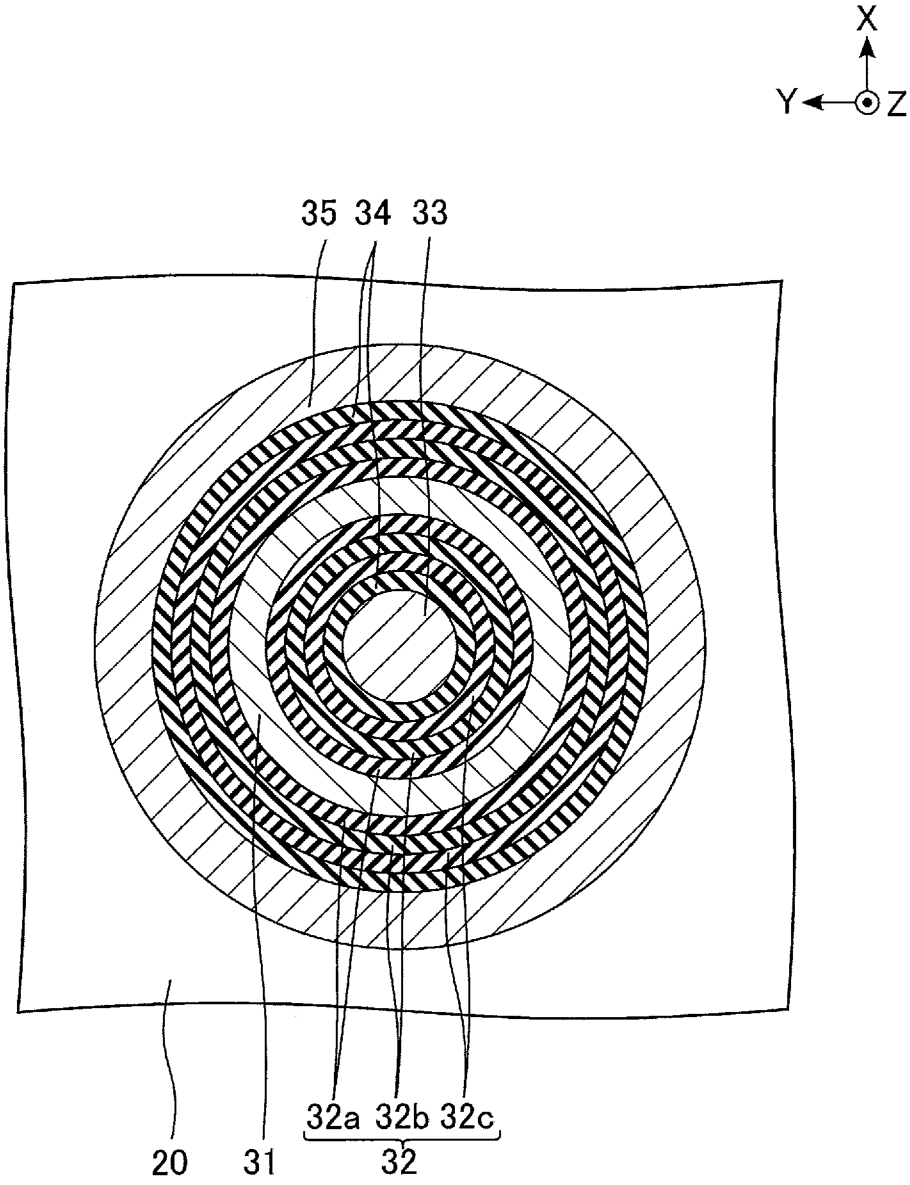
FIG. 6 is a cross-sectional view of a capacitor, taken alone line VI-VI of FIG. 4.

FIG. 6 is a cross-sectional view taken along line VI-VI of FIG. 4, and illustrates an example of a cross-sectional structure of the bottom portion BTM.

As illustrated in FIG. 6, the $n^+$-type impurity diffusion region 33 is provided in a central portion of the bottom portion BTM. Around the $n^+$-type impurity diffusion region 33, the insulating film 34, the block insulating film 32*c*, the charge storage film 32*b*, the tunnel insulating film 32*a*, the semiconductor film 31, the tunnel insulating film 32*a*, the charge storage film 32*b*, the block insulating film 32*c*, and the insulating film 34 are arranged in this order outward from the central portion of the bottom portion BTM to form a film stack surrounding the $n^+$-type impurity diffusion region 33.

The $n^+$-type impurity diffusion region 35 surrounds the side surface of the insulating film 34, which corresponds to an outer periphery of the film stack. The semiconductor layer 20 surrounds the side surface of the $n^+$-type impurity diffusion region 35.

With the configuration described above, the $n^+$-type impurity diffusion region 35 in the bottom portion BTM can function as the capacitor CAP. Specifically, a portion of the semiconductor film 31 that is between the $n^+$-type impurity diffusion region 33 and the $n^+$-type impurity diffusion region 35 is used as an electrode corresponding to a first end of the capacitor CAP. The $n^+$-type impurity diffusion regions 33 and 35 are used as an electrode corresponding to a second end of the capacitor CAP. The film stack 32 and the insulating film 34 are used as a dielectric body located between the two electrodes of the capacitor CAP.

Next, structure including the bit line BLo and the contact CPo, and structure including the bit line BLe and the contact CPe will be explained with reference to FIG. 7.

Figure 7:
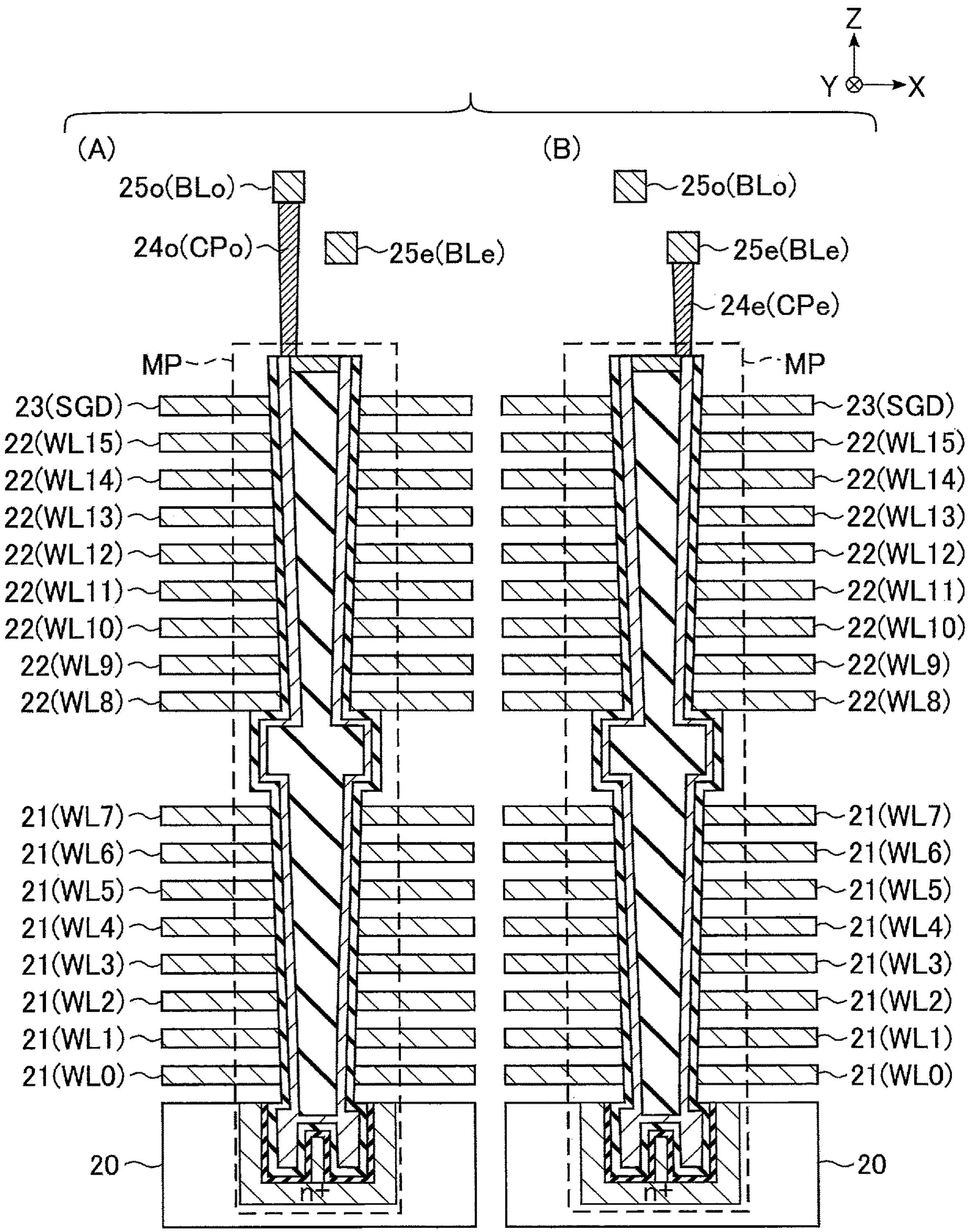
FIG. 7 is a cross-sectional view of the memory cell array, taken along line VII-VII of FIG. 3.

FIG. 7(A) in a left portion of FIG. 7 is a cross-sectional view of the memory cell array 10, taken along line VIIA-VIIA of FIG. 3, and including cross-sectional surfaces of the contact CPo and the bit line BLo along the XZ plane. FIG. 7(B) in a right portion of FIG. 7 is a cross-sectional view of the memory cell array 10, taken along line VIIB-VIIB in FIG. 3, and including cross-sectional surfaces of the contact CPe and the bit line BLe along the XZ plane.

As illustrated in FIG. 7(A), a conductive layer 24*o* functioning as the contact CPo is in contact with, for example, a portion to the left side of a central axis of the memory pillar MP on the upper surface of the memory pillar MP. A conductive layer 25*o* functioning as the bit line BLo is provided on the upper surface of the conductive layer 24*o* and extends in the Y direction. On the other hand, as illustrated in FIG. 7(B), a conductive layer 24*e* functioning as the contact CPe is in contact with a portion to the right side of the central axis of the memory pillar MP on the upper surface of the memory pillar MP. A conductive layer 25*e* functioning as the bit line BLe is provided on the upper surface of the conductive layer 24*e* and extends in the Y direction. Therefore, even if the memory pillar MP in FIG. 7(A) and the memory pillar MP in FIG. 7(B) are arranged alongside each other in the Y direction, interference between the conductive layer 240 and the conductive layer 24*e* can be avoided.

The conductive layer 24*o* and the conductive layer 24*e* are provided at different heights. In the example shown in FIG. 7, the length of the conductive layer 24*o* along the Z axis is longer than the length of the conductive layer 24*e* along the Z axis. Accordingly, the distance between the conductive layer 25*o* and the conductive layer 25*e* can be increased in accordance with the difference in length between the conductive layer 24*o* and the conductive layer 24*e*. Therefore, the value of parasitic capacitance that is generated between the conductive layer 25*o* and the conductive layer 25*e* can be smaller as compared to a case where the length of the conductive layer 24*o* along the Z axis is equal to the length of the conductive layer 24*e* along the Z axis.

The configuration of the memory cell array 10 described above is merely an example, and the memory cell array 10 may have other configurations. For example, the number of the conductive layers 23 and that of the conductive layers 24 are designed based on the number of the word lines WL. A plurality of conductor layers 23 may be respectively assigned to select gate lines SGD. The memory pillar MP may be electrically coupled to the conductor layer 25 via two or more contacts, or via another interconnect. Multiple types of insulators may be provided in the slit SLT.

1.1.4 Configuration of Sense Amplifier Module

Figure 8:
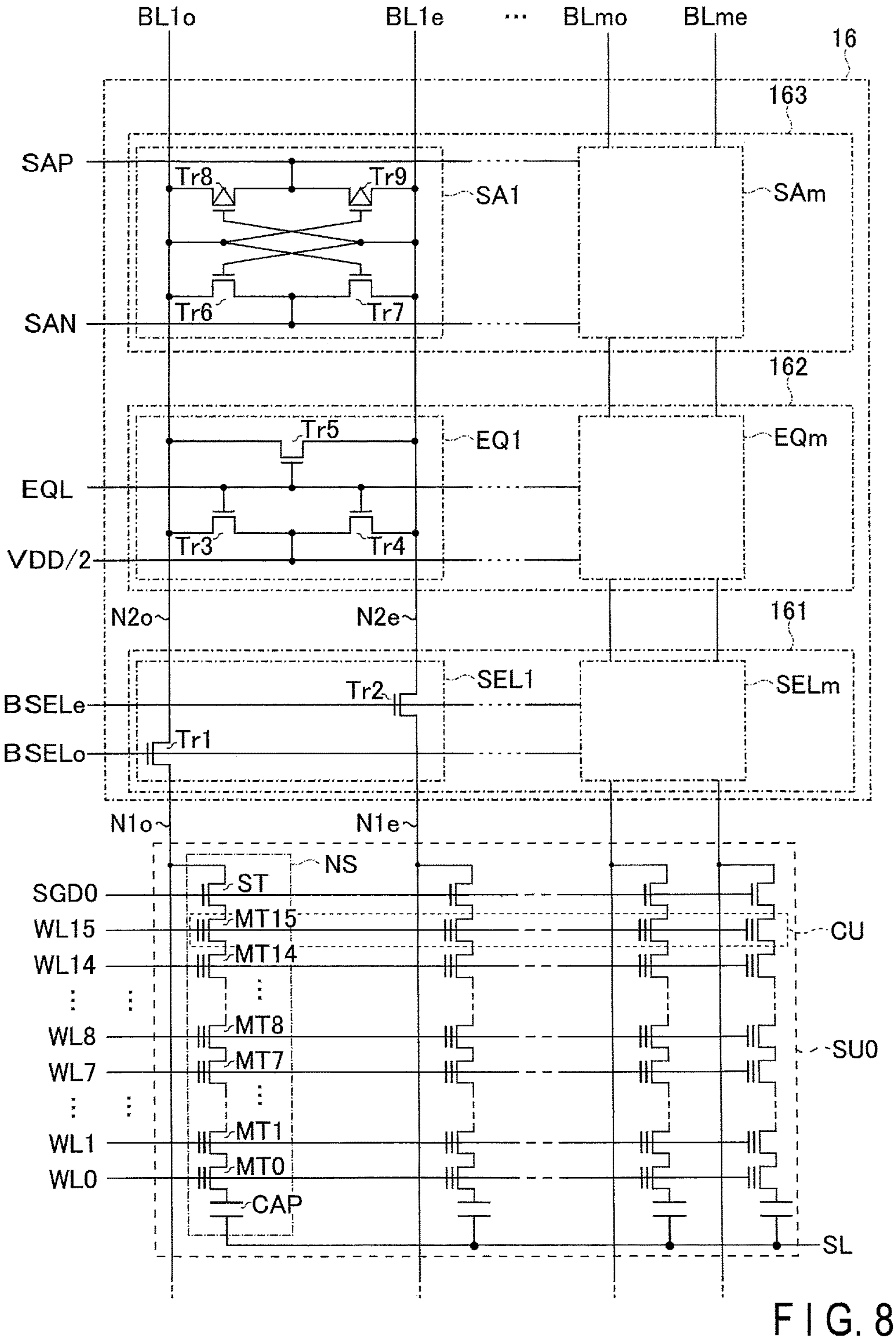
FIG. 8 is a circuit diagram illustrating a configuration of a sense amplifier module of the semiconductor memory device according to the embodiment.

A configuration of the sense amplifier module of the semiconductor memory device according to the embodiment will be explained with reference to the circuit diagram shown in FIG. 8. FIG. 8 illustrates the string unit SU0 of one block BLK in the memory cell array 10 shown in FIG. 2, and the sense amplifier module 16 coupled to the string unit SU0 via bit lines BL1*o* to BLme.

As illustrated in FIG. 8, the sense amplifier module 16 includes a selector module 161, an equalizer module 162, and an amplifier module 163'. Each of the selector module 161, the equalizer module 162, and the amplifier module 163 includes m submodules corresponding to a set of single bit line BLo and a single bit line BLe. In other words, the selector module 161 includes m selector submodules SEL (SEL1 to SELm). The equalizer module 162 includes m equalizer submodules EQ (EQ1 to EQm). The amplifier module 163 includes m amplifier submodules SA (SA1 to SAm).

The submodules in the respective three modules have similar configurations. Therefore, in the following, the configuration of the selector submodule SEL1, the equalizer submodule EQ1, and the amplifier submodule SA1 corresponding to the set of the bit line BL1*o* and the bit line BL1*e* will be explained.

The selector submodule SEL1 includes transistors Tr1 and Tr2. The transistors Tr1 and Tr2 are, for example, n-type transistors.

The transistor Tr1 includes a first end coupled to a node N1*o*, a second end coupled to a node N2*o*, and a gate to which a signal BSELo is supplied. The transistor Tr2 includes a first end coupled to a node N1*e*, a second end coupled to a node N2*e*, and a gate to which signal BSELe is supplied.

The equalizer submodule EQ1 includes transistors Tr3, Tr4, and Tr5. The transistors Tr3 to Tr5 are, for example, n-type transistors.

The transistor Tr3 includes a first end coupled to the node N2*o*, a second end to which a voltage VDD/2 is supplied, and a gate to which a signal EQL is supplied. The transistor Tr4 includes a first end coupled to the node N2*e*, a second end to which the voltage VDD/2 is supplied, and a gate to which the signal EQL is supplied. The transistor Tr5 includes a first end coupled to the node N2*o*, a second end coupled to the node N2*e*, and a gate to which the signal EQL is supplied. The voltage VDD is a power-supply voltage.

The amplifier submodule SA1 includes transistors Tr6, Tr7, Tr8, and Tr9. The transistors Tr6 and Tr7 are, for example, n-type transistors, whereas the transistors Tr8 and Tr9 are, for example, p-type transistors.

The transistor Tr6 includes a first end coupled to the node N2*o*, a second end to which signal SAN is supplied, and a gate coupled to the node N2*e*. The transistor Tr7 includes a first end coupled to the node N2*e*, a second end to which the signal SAN is supplied, and a gate coupled to the node N2*o*.

The transistor Tr8 includes a first end coupled to the node N2*o*, a second end to which signal SAP is supplied, and a gate coupled to the node N2*e*. The transistor Tr9 includes a first end coupled to the node N2*e*, a second end to which the signal SAP is supplied, and a gate coupled to the node N2*o*. For example, the supplied signals SAP and SAN may be mutually inverted.

With the configuration described above, data can be read from the memory cell array 10 via the corresponding bit line BL through the read operation described below.

1.2 Read Operation

Next, the read operation in the semiconductor memory device according to the embodiment will be explained with reference to a timing chart shown in FIG. 9. In FIG. 9, a case is illustrated where data is read from a memory cell transistor MTo coupled to the bit line BLo, and a memory cell transistor MTe coupled to the bit line BLe in different periods.

As illustrated in FIG. 9, before a time t1, a voltage VSS is applied to the bit line BLe, and the voltage VDD is applied to the bit line BLo. The voltage VSS is a ground voltage and lower than, for example, the voltages VDD and VDD/2.

At the time t1, a precharging operation in a read period Tr_o is started. Specifically, the transistors Tr6 to Tr9 enter an inactive state by, for example, the voltage VDD/2 applied as the signals SAP and SAN. The signals BSELe, BSELo, and EQL change from an "L" level to an "H" level. Accordingly, the transistors Tr1 and Tr2 in each of the selector submodules SEL1 to SELm, and the transistors Tr3 to Tr5 in each of the equalizer submodules EQ1 to EQm enter an ON state, and the voltage VDD/2 is applied to the nodes N1*o* and N2*o* of the bit line BLo, and the nodes N1*e* and N2*e* of the bit line BLe. As a result, the voltages at the nodes N1*o* and N2*o*, and the nodes N1*e* and N2*e* become equal.

At a time t2, a sensing operation in the read period Tr_o is started. Specifically, for example, the signal EQL changes from the "H" level to the "L" level, and the signal BSELe also changes from the "H" level to the "L" level. Accordingly, the transistors Tr3 to Tr5 in each of the selector submodules EQ1 to EQm enter an OFF state, and the transistors Tr2 in each of the selector submodules SEL1 to SELm also enter the OFF state. As a result, the node N2*e* of the bit line BLe enters a floating state with respect to the nodes N2*o* and N1*e*.

The row decoder module 15 applies a voltage VCGR to a selected word line WL coupled to a (selected) memory cell transistor MT which is a target of reading, and applies a voltage VREAD to non-selected word lines WL coupled to (non-selected) memory cell transistors MT which are not a target of reading. The voltage VCGR is a voltage that is compared with a threshold voltage of the selected memory cell transistor MTo. If the threshold voltage of the selected memory cell transistor MT is higher than the voltage VCGR, the selected memory cell transistor MTo enters the OFF state, and if lower than the voltage VCGR, the selected memory cell transistor MTo enters the ON state. The voltage VREAD is a voltage that is higher than the voltage VCGR and causes the memory cell transistor MT to enter the ON state, regardless of the threshold voltage of the memory cell transistor MT.

As a result, in the NAND string NS including the selected memory cell transistor MTo, if the selected memory cell transistor MTo is in the ON state, the bit line BLo and the capacitor CAP are electrically coupled, and if in the OFF state, the bit line BLo and the capacitor CAP are electrically insulated.

In addition, at the time t2, the voltage VDD is applied as the signal SAP, and the voltage VSS is applied as the signal SAN. As a result, the transistors Tr6 to Tr9 enter the active state. When the bit line BLo and the capacitor CAP are electrically coupled, the voltage at the bit line BLo is reduced for example, depending on the magnitude relationship with the value of the capacitance of the capacitor CAP. Accordingly, the transistor Tr9 enters a more intense ON state, and the voltage at the node N2*e* is increased to be close to the voltage VDD. As the voltage at the node N2*e* is increased, the transistor Tr6 enters a more intense ON state, and the voltage at the node Ngo is reduced to be close to the voltage VSS. As a result, the amplifier submodule SA can amplify a potential difference between the bit line BLo and the bit line BLe, which are paired, to be approximate to the voltage VDD.

On the other hand, when the bit line BLo and the capacitor CAP are electrically insulated, the voltage at the bit line BLo does not substantially change. Therefore, the amplifier submodule SA does not amplify the potential difference between the bit line BLo and the bit line BLe, which are paired.

The sense amplifier module 16 compares by a comparator circuit (not shown) the voltages of, for example, the bit line BLo and the bit line BLe which are paired, and determines whether the difference therebetween is a predetermined potential value or greater. Thus, the data stored in the selected memory transistor MTo can be read.

At a time t3, the signal BSELo changes from the "H" level to the "L" level, and the voltages at the node N2*o* of the bit line BLo and the node N2*e* of the bit line BLe are respectively reset to the voltages VDD and VSS.

The read period Tr_o is thus ended.

Subsequently, at a time t4, a precharging operation in a read period Tr_e is started. Since this operation is the same as the precharging operation in the read period Tr_e at the time t2, explanations thereof are omitted.

At a time t5, a sensing operation in the read period Tre is started. Specifically, for example, the signal EQL changes from the "H" level to the "L" level, and the signal BSELo also changes from the "H" level to the "L" level. Accordingly, the transistors Tr3 to Try in each of the equalizer submodules EQ1 EQm enter the OFF state, and the transistor Tr1 in each of the selector submodules SEL1 to SELm also enters the OFF state. Consequently, the node N2*o* of the bit line BLo enters a floating state with respect to the nodes N2*e* and N1*o*.

The row decoder module 15 applies a voltage VCGR to the selected word line WL coupled to the selected memory cell transistor MT, and applies a voltage VREAD to the non-selected word lines WL coupled to the non-selected memory cell transistors MT.

As a result, the NAND string NS including the selected memory cell transistor MTe electrically couples the bit line BLe and the capacitor CAP when the selected memory cell transistor MTe is in the ON state, and electrically insulates the bit line BLe and the capacitor CAP when in the OFF state.

When the bit line BLe and the capacitor CAP are electrically coupled, the voltage at the bit line BLe is reduced for example, depending on the magnitude relationship with the value of the capacitance of the capacitor CAP. Accordingly, the transistor Tr8 enters a more intense ON state, and the voltage at the node N2*o* is increased to be close to the voltage VDD. As the voltage at the node N2*o* is increased, the transistor Tr7 enters a more intense ON state, and the voltage at the node N2*e* is reduced to be close to the voltage VSS. As a result, the amplifier submodule SA can amplify a potential difference between the bit line BLo and the bit line BLe, which are paired, to be approximate to the voltage VDD.

On the other hand, when the bit line BLe and the capacitor CAP are electrically insulated, the voltage at the bit line BLe does not substantially change. Therefore, the amplifier submodule SA does not amplify the potential difference between the bit line BLo and the bit line BLe, which are paired.

The sense amplifier module 16 compares by the aforementioned comparator circuit the voltages of, for example, the bit line BLo and the bit line BLe which are paired, and determines whether the difference therebetween is a predetermined potential value or greater. Thus, the data stored in the selected memory cell transistor MTe can be read.

At a time t6, the signal BSELe changes from the "H" level to the "L" level, and the voltages at the node N2*o* of the bit line BLo and the node N2*e* of the bit line BLe are respectively reset to the voltages VDD and VSS.

The read period Tr_e is thus ended.

Thus, the read operation for one cell unit CU is ended.

The order of the read periods Tr_o and Tr_e are not limited to that in the example of FIG. 9, but may be reversed.

1.3 Manufacturing Method

Hereinafter, an example of a series of manufacturing steps from formation of a NAND string NS to formation of a bit line BL in the semiconductor memory device according to the embodiment will be described. Each of FIG. 10 to FIG. 28 illustrates an example of a cross-sectional structure including a structure corresponding to the memory cell array in the manufacturing steps of the semiconductor memory device according to the embodiment. FIG. 10 to FIG. 28 illustrate the portion corresponding to FIG. 7.

First, as illustrated in FIG. 10, holes H1 corresponding to the bottom portions BTM are formed in regions of the semiconductor substrate 20 where the memory pillars MP are to be formed. Specifically, first, a mask in which regions corresponding to the bottom portions BTM are opened is formed by photolithography, etc. The holes H1 are then formed by anisotropic etching using the formed mask. The anisotropic etching in this step is, for example, reactive ion etching (RIE).

Next, as illustrated in FIG. 11, a sacrificial member 41 is provided on the upper surface of the semiconductor substrate 20. The sacrificial member 41 includes, for example, silicon nitride (SiN). The sacrificial member 41 may or may not completely fill the holes H1.

Next, as illustrated in FIG. 12, regions where the $n^+$-type impurity diffusion regions 33 are to be formed are etched from the sacrificial member 41 provided in the holes H1. As a result, the semiconductor substrate 20 is exposed in the regions where the $n^+$-type impurity diffusion regions 33 are to be formed. The anisotropic etching in the present step is, for example, the RIE.

Next, as illustrated in FIG. 13, a semiconductor film 42 is provided on the sacrificial member 41 and the exposed upper surfaces of the semiconductor substrate 20, and fill in the holes H1. The semiconductor film 42 includes, for example, amorphous silicon.

Next, as illustrated in FIG. 14, the semiconductor film 42 is etched back to expose the sacrificial member 41, and the semiconductor film 42 is divided into portions for the respective memory pillars MP. Accordingly, columnar semiconductor films 42 are formed in central portions of the holes H1.

Next, as illustrated in FIG. 15, the sacrificial member 41 is selectively removed by, for example, wet etching.

Next, as illustrated in FIG. 16, an n-type impurity, such as phosphorus (P), is injected into the side surfaces and the bottom surfaces of the holes H1 by ion implantation. Accordingly, parts of the semiconductor substrate 20 that include the side surfaces and the bottom surfaces of the holes H1 and the semiconductor films 42 enter the $n^+$-type impurity diffusion regions 35 and 33, respectively. Thus, the electrodes corresponding to the second ends of the capacitors CAP are formed.

Next, as illustrated in FIG. 17, the interiors of the holes H1 are subjected to an oxidation treatment, thereby forming insulating films 34. As a result, the interiors of the holes H1 are covered by an insulator including silicon oxide.

Next, as illustrated in FIG. 18, sacrificial member 43 is provided over the entire surface and fill in the holes H1 again. Thereafter, a part of the sacrificial member 43 formed on the upper surface of the semiconductor substrate 20 is removed by etch-back processing. As a result, the upper surface of the semiconductor substrate 20 is exposed, and the sacrificial member 43 is divided into portions for the respective memory pillars MP.

Next, as illustrated in FIG. 19, insulating layers 51 and sacrificial members 52 are alternately stacked more than once on the upper surfaces of the semiconductor substrate 20 and the sacrificial members 43. An insulating layer 53 thicker than each insulating layer 51 is stacked on the uppermost insulating layer 51. The insulating layers 51 and 53 include, for example, silicon oxide, and the sacrificial members 52 include, for example, silicon nitride.

Then, as illustrated in FIG. 20, holes H2 corresponding to the lower pillars LMP are formed. Specifically, first, a mask in which regions corresponding to the holes H2 are opened is formed by photolithography, etc. The holes H2 are then formed by anisotropic etching using the formed mask.

The holes H2 formed in this step penetrate a layer stack of the insulating layer 53, the sacrificial members 52, and the insulating layers 51, and reaches the corresponding sacrificial members 43. The anisotropic etching in the present step is, for example, the RIE.

Next, as illustrated in FIG. 21, a sacrificial member 44 is provided on the upper surfaces of the insulating layer 53 and in the interiors of the holes H2, thereby filling in the holes H2. The sacrificial member 44 includes, for example, amorphous silicon. Thereafter, the etch-back processing is performed on the sacrificial member 44, to remove part above the upper surface of the insulating layer 53 and parts in the same layer as the insulating layer 53 inside the holes H2. The insulating layer 53 are subjected to slimming, so that the insulating layer 53 is etched from the interiors of the holes H2. Accordingly, the diameters of the portions of the holes H2 in the same layer as the insulating layer 53 are extended, thereby forming spaces corresponding to joint portions JT. The spaces are filled again with the sacrificial members 44.

Next, as illustrated in FIG. 22, the sacrificial members 54 and the insulating layers 55 are alternately stacked more than once on the upper surfaces of the insulating layer 53 and the sacrificial members 44. The sacrificial members 54 include, for example, silicon nitride, and the insulating layers 55 include, for example, silicon oxide.

Figure 23:
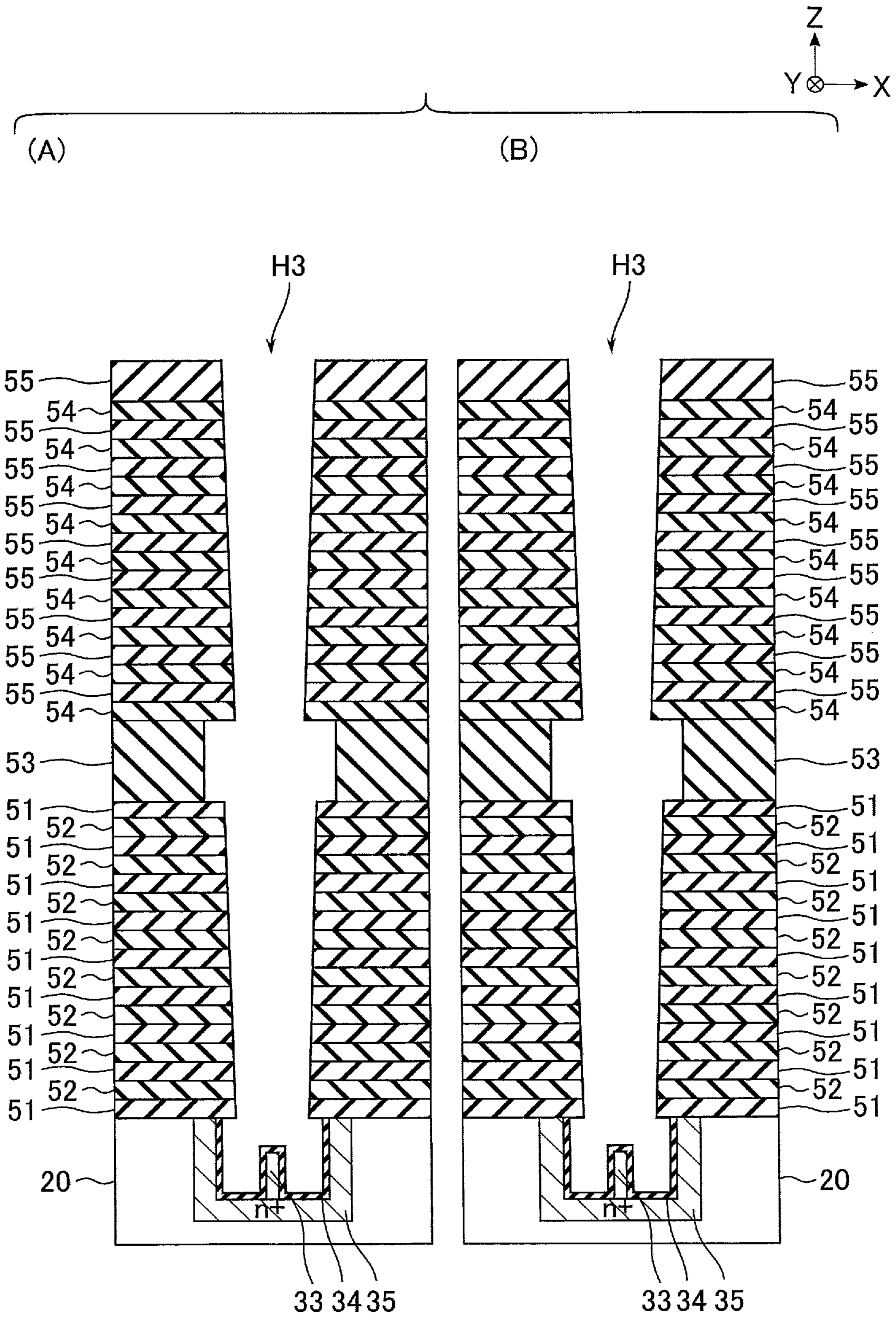
FIG. 23 is cross-sectional view of the memory cell array for illustrating a manufacturing step of the semiconductor memory device according to the embodiment.

Then, as illustrated in FIG. 23, holes H3 corresponding to the memory pillars MP are formed. Specifically, first, a mask in which regions corresponding to the holes H3 are opened is formed by photolithography, etc. Then, parts of the layer stack of the sacrificial members 54 and the insulating layers 55 that correspond to the upper pillars UMP are etched by anisotropic etching using the formed mask. The sacrificial members 44 are thereby exposed.

Subsequently, the sacrificial members 44 and 43 are selectively etched by, for example, wet etching which allows silicon to be selectively etched. As a result, the holes H3 are formed. The insulating films 34 are exposed by the removal of the sacrificial members 43; however, since the insulating films 34 have a lower selection ratio with respect to the selective etching of the sacrificial members 44 and 43, the insulating films 34 can function as a stop film for the etching. Therefore, the $n^+$-type impurity diffusion regions 33 and 35, and the semiconductor substrate 20 can be prevented from being etched by the etching.

Next, the block insulating film 32*c*, the charge storage film 32*b*, and the tunnel insulating film 32*a* are provided in this order in each hole H3, thereby forming the film stack 32, as illustrated in FIG. 24. Subsequently, the semiconductor film 31 is formed in the holes H3. The semiconductor film 31 is formed in the holes H3 on the film stack 32 in the bottom portion BTM, so that the thickness exceeds a predetermined thickness before a space between the $n^+$-type impurity diffusion region 33 and the lowermost insulating layer 51 is closed. Thus, the semiconductor film 31 can function as the electrode corresponding to the first end of the capacitor CAP.

Next, as illustrated in FIG. 25, the core member 30 is provided in the interiors of the holes H3, thereby filling in the holes H3. Parts of the core member 30 formed in the holes H3 that are located in the same layer as the uppermost insulating layer 55 are removed to form spaces, and the semiconductor portions 36 are embedded in the spaces. Thereafter, the film stack 32, the semiconductor film 31, and the semiconductor portion 36 that remain in a layer above the uppermost insulating layer 55 are removed. As a result, the memory pillars MP are formed.

Next, as illustrated in FIG. 26, the sacrificial members 52 are replaced with the conductive layers 21, and the sacrificial members 54 are replaced with the conductive layers 22 and 23. Specifically, a hole (not shown) is formed in a region corresponding to the slit SLT. The bottom end of the hole reaches a portion below the lowermost sacrificial member 52. Accordingly, the sacrificial members 52 and 54 are exposed in the hole. Subsequently, the sacrificial members 52 and 54 are removed via the hole by wet etching or the like that allows the sacrificial members 52 and 54 to be selectively removed. Then, the conductive layers 21 to 23 are provided in the space left after the removal of the sacrificial members 52 and 54. After the conductive layers 21 to 23 are provided, an insulating layer 57 is formed in the hole corresponding to the slit. SLT, thereby forming the slit SLT.

Subsequently, a hole (not shown) is formed in a region corresponding to the slit SHE. For example, the hole penetrates through, for example, the conductive layer 23, and the bottom end of the hole is located above the uppermost conductive layer 22. An insulating layer 58 is formed in the hole corresponding to the slit SHE, thereby forming the slit SHE.

Next, as illustrated in FIG. 27, the contact CPe and the bit line BLe are formed. Specifically, after insulating layers 56 are formed on the memory pillars MP, holes corresponding to the contacts CPe are formed by anisotropic etching with respect to the insulating layers 56. Accordingly, the semiconductor portions 36 of the memory pillars MP corresponding to the contacts CPe are exposed. Then, the contacts CPe are formed by filling the holes with the conductive layers 24*e*.

Subsequently, the insulating layer 57 is formed on the insulating layers 56 and the conductive layers 24*e*, and thereafter trenches corresponding to the bit lines BLe and extending along the Y axis are formed by anisotropic etching with respect to the insulating layer 57. As a result, a plurality of conductive layers 24*e* that are coupled in common to the bit line BLe and extend alongside each other along the Y axis are exposed. The trenches are filled with the conductive layers 25*e*, and the bit lines BLe are formed.

Next, as illustrated in FIG. 28, a contact CPo and a bit line BLo are formed. Specifically, insulating layers 58 are formed on the memory insulating layer 57 and the conductive layers 25*e*, and thereafter holes corresponding to the contacts CPo are formed by anisotropic etching with respect to the insulating layers 58. Accordingly, the semiconductor portions 36 of the memory pillars MP corresponding to the contacts CPo are exposed. Then, the contacts CPo are formed by filling the holes with the conductive layers 24*o*.

Subsequently, insulating layers 59 are formed on the insulating layers 58 and the conductive layers 24*o*, and thereafter trenches corresponding to the bit lines BLo and extending along the Y axis are formed by anisotropic etching with respect to the insulating layers 59. As a result, a plurality of conductive layers 24*o* that are coupled in common to the bit line BLe and extend alongside each other along the Y axis are exposed. The trenches are filled with the conductive layers 25*o*, and the bit lines BLe are formed.

Through the process described above, a series of manufacturing steps from formation of a NAND string NS to formation of a bit line BL is ended.

1.4 Advantageous Effect of Present Embodiment

When forming a NAND string NS configured to be electrically coupled to a source line SL, a step of bringing the semiconductor film 31 in the memory pillar MP and the source line SL into conduction is executed. Specifically, a hole penetrating through the sacrificial members 52 and 54 and reaching the source line SL is formed, and the film stack 32 is formed in the hole. Thereafter, to bring the semiconductor film 31 formed subsequently and the source line SL into conduction, the film stack 32 formed on the bottom surface or a part of the side surface near the bottom surface of the hole is removed. However, as the number of sacrificial members 52 and 54 increases, the hole to access the source line SL from above the sacrificial members 52 and 54 becomes very deep. Therefore, the step of removing the film stack 32 near the bottom surface of the hole may be very difficult. Accordingly, the load on the process of manufacturing the memory cell array 10 may be increased.

According to the present embodiment, the source line SL and the NAND string NS are electrically insulated by the capacitor CAP. Accordingly, the step of bringing the semiconductor film 31 in the memory pillar MP and the source line SL into conduction is unnecessary, so that the increase in the load on the process of manufacturing the memory cell array 10 can be suppressed.

Specifically, the $n^+$-type impurity diffusion regions 33 and 35 functioning as the electrode of the capacitor CAP on the source line SL side are formed in the semiconductor substrate 20 in advance, before the sacrificial members 52 and 54 are stacked. The film stack 32, which functions as the charge storage film 32*b* of the memory cell transistor MT and the dielectric body of the capacitor CAP, is formed as a continuous film. The semiconductor film 31, which functions as the channel of the memory cell transistor MT and the electrode on the bit line BL side of the capacitor CAP, is formed as a continuous film. Therefore, with regard to the capacitor CAP, a step of forming the source line SL side electrode, a step of forming the dielectric body, and the step of forming the bit line BL side electrode can be realized by a step of forming three films. Accordingly, the step of removing a portion of the film stack 32 formed near the bottom of the hole H3 is unnecessary, so that the increase in the load on the process of manufacturing the memory cell array 10 can be suppressed.

With the configuration described above, the NAND string NS is always electrically insulated from the source line SL without switching between the ON state and the OFF state of the select transistor coupled to the select gate line SGS. Therefore, no current flows through the NAND string NS regardless of whether the selected memory cell transistor MT is in the ON state or not in the read operation.

According to the embodiment, in the read operation, the sense amplifier module 16 reads data by sensing the voltage at the bit line BL. Specifically, the sense amplifier module 16 equalizes the voltages at the bit lines BLo and BLe. Thereafter, the sense amplifier module 16 brings one of the bit lines BLo and BLe into conduction with the NAND string NS, and the other one into a floating state. Accordingly, when the selected memory cell transistor MT is in the ON state, the voltage at the node N2 of the bit line BL that is in conduction with the NAND string NS is reduced, depending on the magnitude relationship of the capacitance between the bit line BL and the capacitor CAP. On the other hand, when the selected memory cell transistor MT is in the OFF state, the voltage at the node N2 of the bit line BL that is in conduction with the NAND string NS does not substantially change. The sense amplifier module 16 senses a difference in voltage change at the node N2, thereby reading the data stored in the selected memory cell transistor MTo.

To sense a difference in voltage change of the bit line BLo with high accuracy in the read operation described above, it is preferable that the capacitance of the capacitor CAP be about 10% or more of the capacitance of the bit line BL. In other words, it is preferable that the capacitance of the capacitor CAP be as large as possible, while the capacitance of the bit line BL be as small as possible.

According to the embodiment, the $n^+$-type impurity diffusion region 35 includes the portion 35A located above the bottom end of the semiconductor film 31, and the portion 35B located below the bottom end of the semiconductor film 31. Furthermore, the $n^+$-type impurity diffusion region 33 is located above the bottom end of the semiconductor film 31, in contact with the portion 35B, and separated from the portion 35A. Accordingly, the semiconductor film 31 in the bottom portion BTM has a cylindrical shape, and the inner surface, the bottom surface, and the outer surface of the cylindrical shape can function as an electrode of the capacitor CAP. Therefore, the area of the electrodes can be increased, so that the capacitance of the capacitor CAP can be increased.

Furthermore, according to the embodiment, adjacent bit lines BLo and BLe are provided at different heights. As a result, the parasitic capacitance between the bit lines BLo and BLe can be reduced, so that the capacitance of the bit lines BL can be reduced.

2. Others

The embodiment has been described above as an example, in which the sense amplifier module 16 includes a submodule shared by a set of a single bit line BLo. and a single bit line BLe; however, the embodiment is not limited to this example. For example, the sense amplifier module 16 may include a submodule for every bit line BL. In this case, the read operation is not divided into two read periods, and the voltage can be sensed at the same time for all bit lines BL.

Furthermore, the embodiment has been described above as an example, in which the capacitor CAP is formed in the semiconductor substrate 20; however, the embodiment is not limited to this example. For example, the capacitor CAP may be formed in another semiconductor layer (not shown) formed between the semiconductor substrate 20 and the conductive layer 21. In this case, the peripheral circuits, such as the row decoder module 15 and the sense amplifier module 16, may be provided between the semiconductor layer and the semiconductor substrate 20.

In addition, the embodiment has been described above as an example, in which the present invention is applied to a three-dimensional stacked-type semiconductor memory device 10 that includes NAND strings NS extending in the Z direction above the semiconductor substrate 20; however, the embodiment is not limited to this example. For example, the present invention is applicable to a two-dimensional stacked-type semiconductor memory device 10 that includes NAND strings NS extending within the XY plane.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor memory device comprising:
a first bit line;
a first capacitor;
a first memory cell transistor and a second memory cell transistor that are coupled in series between the first bit line and the first capacitor;
a second bit line;
a second capacitor;
a third memory cell transistor and a fourth memory cell transistor that are coupled in series between the second bit line and the second capacitor;
a fifth memory cell transistor electrically coupled in series to the second memory cell transistor; and
a sixth memory cell transistor electrically coupled in series to the fourth memory cell transistor,
wherein
the first capacitor includes a first end configured to be electrically coupled to the first bit line, and a second end that is grounded,
the second capacitor includes a third end configured to be electrically coupled to the second bit line, and a fourth end that is grounded,
the first end and the third end are electrically separated,
the first end of the first capacitor is physically connected in series only to the fifth transistor and is not physically connected to any transistor other than the fifth transistor, and
the third end of the second capacitor is physically connected in series only to the sixth transistor and is not physically connected to any transistor other than the sixth transistor.

2. The semiconductor memory device according to claim 1, further comprising a select transistor electrically coupled to the first bit line,
the first memory cell transistor and the second memory cell transistor being coupled in series between the select transistor and the capacitor.

3. A semiconductor memory device comprising:
a first bit line;
a first capacitor;
a first memory cell transistor and a second memory cell transistor that are coupled in series between the first bit line and the first capacitor;
a second bit line;
a second capacitor; and
a third memory cell transistor and a fourth memory cell transistor that are coupled in series between the second bit line and the second capacitor,
wherein
the first capacitor includes a first end configured to be electrically coupled to the first bit line, and a second end that is grounded,
the second capacitor includes a third end configured to be electrically coupled to the second bit line, and a fourth end that is grounded, and
the first end and the third end are electrically separated,
the first end of the first capacitor is physically connected only to one transistor of all transistors, including the first transistor and the second transistor, connecting between the first bit line and the first capacitor, and
the third end of the second capacitor is physically connected only to one transistor of all transistors, including the third transistor and the fourth transistor, connecting between the second bit line and the second capacitor.

4. The semiconductor memory device according to claim 3, further comprising a select transistor electrically coupled to the first bit line,
the first memory cell transistor and the second memory cell transistor being coupled in series between the select transistor and the capacitor.

* * * * *